(12) United States Patent
Maeda et al.

(10) Patent No.: US 7,092,682 B2
(45) Date of Patent: Aug. 15, 2006

(54) ELECTRONIC CIRCUIT, MODULATION METHOD, INFORMATION PROCESSING DEVICE, AND INFORMATION PROCESSING METHOD

(75) Inventors: Tatsuo Maeda, Kanagawa (JP); Akihiko Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 497 days.

(21) Appl. No.: 10/681,305

(22) Filed: Oct. 9, 2003

(65) Prior Publication Data

US 2004/0132417 A1 Jul. 8, 2004

(30) Foreign Application Priority Data

Oct. 16, 2002 (JP) ............................. 2002-301256

(51) Int. Cl.
*H04B 1/02* (2006.01)
(52) U.S. Cl. .................. 455/108; 455/102; 455/110; 455/203; 375/244; 375/298; 375/300
(58) Field of Classification Search ................ 455/108, 455/109, 102, 129, 114.2; 375/244, 298, 375/300
See application file for complete search history.

(56) References Cited

U.S. PATENT DOCUMENTS 3,550,040 A * 12/1970 Sinusas ...................... 332/168
4,142,162 A * 2/1979 Huntley ...................... 332/168
4,292,598 A * 9/1981 Yasumura .................... 330/281
4,293,736 A * 10/1981 Ogita ............................. 381/4
4,520,328 A 5/1985 Murakami et al.
5,054,116 A * 10/1991 Davidson ................... 455/126
5,079,525 A * 1/1992 Ishikawa et al. ............ 332/120
5,172,079 A * 12/1992 Shigenari .................... 332/168
5,239,275 A * 8/1993 Leitch ........................ 332/152
6,816,016 B1 * 11/2004 Sander et al. ............... 330/295

OTHER PUBLICATIONS

Patent Abstracts of Japan, JP 2002-217483, Aug. 2, 2002.

* cited by examiner

*Primary Examiner*—Nay Maung
*Assistant Examiner*—Richard Chan
(74) *Attorney, Agent, or Firm*—Oblon, Spivak, McClelland, Maier & Neustadt, P.C.

(57) ABSTRACT

A shaped-wave application section inputs a first pulse signal corresponding to transmission data output from a transmission data output section, and applies, to a modulation and amplification section, a signal wave corresponding to a second pulse signal such that the waveform of the first pulse signal is shaped. The pulse signal applied to the base of the transistor of the modulation and amplification section is amplitude-modulated into an amplitude-modulated wave in which the amplitude-modulated portion is strengthened, in accordance with the signal wave corresponding to the second pulse signal applied to the emitter thereof. The amplitude-modulated wave is supplied to an antenna section including a resonance circuit via the collector thereof, and is transmitted as an electromagnetic wave from the antenna section.

16 Claims, 17 Drawing Sheets

US 7,092,682 B2

ELECTRONIC CIRCUIT, MODULATION METHOD, INFORMATION PROCESSING DEVICE, AND INFORMATION PROCESSING METHOD

BACKGROUND OF THE INVENTION

1. Field of the Invention

The present invention relates to an electronic circuit, a modulation method, an information processing device, and an information processing method. More particularly, the present invention relates to an electronic circuit in which, when digital data is transmitted based on amplitude modulation via an antenna including a resonance circuit, the frequency of occurrence of communication failures at the receiving side is reduced, to a modulation method therefor, to an information processing device therefor, and to an information processing method therefor.

2. Description of the Related Art

An IC (Integrated Circuit) card system to which non-contact communication technology is applied is formed of a portable IC card and a commonly called reader/writer device (hereinafter referred to as an "R/W device") that reads information stored in the IC card in a non-contact manner and that is capable of causing predetermined information to be stored in the IC card in a non-contact manner (for example, refer to Japanese Unexamined Patent Application Publication No. 10-13312 corresponding to U.S. Pat. No. 6,126,077).

More specifically, IC card systems are highly convenient systems capable of reading and writing information in a non-contact manner, and, for example, in recent years, have been used as alternative systems for conventional magnetic card systems typified by commuter passes and authentication cards.

Hitherto, the transmission section (the transmission section formed of an antenna and a section for transmitting digital data within a modulator-demodulator) within the R/W device of the IC card system is configured as shown in, for example, FIG. 1. In the following, such a transmission section will be referred to as a "transmission device" by assuming it to be a single device.

More specifically, as shown in FIG. 1, a transmission device 1 is provided with a carrier-wave output section 11 for outputting a carrier wave 21 of a predetermined frequency (for example, 13.56 MHz), a transmission data output section 12 for outputting a signal wave (rectangular wave) 22 of a predetermined frequency (for example, 212 kHz), which corresponds to the digital data to be transmitted (hereinafter referred to as "transmission data"), a modulation and amplification section 13 for generating an amplitude-modulated wave 23 by varying and amplifying the amplitude of the carrier wave 21 in accordance with the signal wave 22 and for outputting the amplitude-modulated wave 23, and an antenna section 14, having a resonance circuit formed of a coil La and a capacitor Ca, for outputting an electromagnetic wave 24 based on the amplitude-modulated wave 23 (for example, transmitting the electromagnetic wave 24 to an IC card (not shown)).

The modulation and amplification section 13 also functions as a drive section (drive) for the antenna section 14 when viewed from the antenna section 14, as will be described later. Accordingly, hereinafter, the modulation and amplification section 13 will also be referred to as an "antenna drive section 13".

More specifically, for example, the transmission device 1 is configured as shown in FIG. 2.

That is, the modulation and amplification section 13 is formed of a transistor TR1 and a transistor TR2 for modulation and amplification, a switch SW, a resistor R1 and a resistor R2, which act as emitter loads of the transistor TR1 and the transistor TR2, a coil L1, a coil L2, a capacitor C1, and the primary side of a transformer Tr.

The carrier-wave output section 11 is connected to the bases of the transistor TR1 and the transistor TR2. However, a reverse phase of the carrier wave 21 input to the base of the transistor TR1 is input to the base of the transistor TR2.

One end of the resistor R1, whose other end is grounded, is connected to the emitters of the transistor TR1 and the transistor TR2, and one end of the resistor R2, whose other end is connected to the switch SW, is also connected thereto. The other end with regard to the end connected to the resistor R2 of the switch SW is grounded. This switch SW performs a switching operation in accordance with a change in a pulse signal 22 input from the transmission data output section 12.

One end of the coil L1, to whose other end a voltage Vcc1 is applied, is connected to the collector of the transistor TR1, and a resonance circuit formed of the capacitor C1 and the primary-side coil of the transformer Tr is also connected to the collector. In a similar manner, one end of the coil L2, to whose other end a voltage Vcc1 is applied, is connected to the collector of the transistor TR2, and a resonance circuit formed of the capacitor C1 and the primary-side coil of the transformer Tr is also connected to the collector.

The antenna section 14 is configured as a closed circuit in which a secondary-side coil La of the transformer Tr, a resistor Ra, and a capacitor Ca are connected in parallel. That is, the antenna section 14 operates in such a manner that the coil La part functions as a loop antenna, and also operates as an LCR resonance circuit formed of the coil La, the resistor Ra, and the capacitor Ca.

Next, the operation of the transmission device 1 of FIG. 2 will be described.

The carrier wave 21 of 13.56 MHz is always supplied from the carrier-wave output section 11 to the bases of the transistor TR1 and the transistor TR2.

In this state, when the pulse signal 22 of 212 KHz, corresponding to the transmission data, is output from the transmission data output section 12, the switch SW performs a switching operation in accordance with the change in the pulse signal 22. That is, when the switch SW is in an on state, since the resistor R2 is connected to the circuit, the emitter loads of the transistor TR1 and the transistor TR2 become the combined resistance value of the resistor R1 and the resistor R2. In contrast, when the switch SW is in an off state, since the resistor R2 is disconnected from the circuit, the emitter loads of the transistor TR1 and the transistor TR2 become the resistance value of the resistor R1.

In this manner, the emitter loads of the transistor TR1 and the transistor TR2 vary in accordance with the pulse signal 22 (transmission data) input from the transmission data output section 12. Then, as a result of the emitter loads of the transistor TR1 and the transistor TR2 being varied, the emitter current varies, and the amplitude of the collector voltage Vc also varies between two levels. That is, the collector voltage Vc corresponds to an amplitude-modulated wave 23.

The amplitude level of an electromagnetic wave 24 output from the coil La of the antenna section 14 also varies in accordance with the change of the amplitude of the collector voltage Vc (the amplitude-modulated wave 23).

In other words, the carrier wave 21 input to the bases of the transistor TR1 and the transistor TR2 is amplitude-modulated and amplified in accordance with the pulse signal 22 having two levels (by the change of the emitter current (signal wave) of the transistor TR1 and the transistor TR2, which corresponds to the change of the pulse signal 22), that is, a low level and a high level, forming the amplitude-modulated wave 23 having amplitudes of two levels, that is, a first level corresponding to the high level of the pulse signal 22 and a second level corresponding to the low level of the pulse signal 22. The amplitude-modulated wave 23 is supplied to the antenna section 14 via the collectors of the transistor TR1 and the transistor TR2. The antenna section 14 outputs the electromagnetic wave 24 based on the supplied amplitude-modulated wave 23, that is, the electromagnetic wave 24 having two amplitude levels corresponding to the first and second levels.

However, when the electromagnetic wave 24 (digital data corresponding to the pulse signal 22 superimposed onto the carrier wave 21) transmitted from the antenna section 14 of the transmission device 1 of FIG. 2 in accordance with the above-described operation is received by an IC card having a limiter for limiting the input and is demodulated, the data demodulated in the operating region of the limiter is distorted, and as a result, a problem arises in that communication failures occur often.

SUMMARY OF THE INVENTION

The present invention has been made in view of such circumstances. An object of the present invention is to reduce the frequency of occurrence of communication failures at the receiving side in a case where digital data is transmitted via an antenna including a resonance circuit on the basis of amplitude modulation.

To achieve the above-mentioned object, in one aspect, the present invention provides a first electronic circuit for amplitude-modulating digital data transmitted via an antenna including a resonance circuit, the electronic circuit including: a modulation circuit, having a first transistor, for amplitude-modulating a carrier wave applied to the base of the first transistor into an amplitude-modulated wave in accordance with a signal wave applied to the emitter of the first transistor and for supplying the amplitude-modulated wave to an antenna via the collector of the first transistor; and a signal-wave generation circuit for inputting a first pulse signal in a rectangular waveform corresponding to the digital data, for generating the signal wave in such a manner as to correspond to a second pulse signal whose waveform is shaped so that the level at each rise time of each pulse of the first input pulse signal becomes higher than the high level in a steady state of the first signal and the level at each fall time of each pulse of the first input pulse signal becomes lower than the low level in the steady state of the first pulse signal, and for applying the generated signal wave to the emitter of the first transistor.

The signal-wave generation circuit may include a load circuit, which serves as an emitter load of the first transistor; a load varying circuit for varying the emitter load of the load circuit in accordance with the first pulse signal; and an extraction circuit for extracting high-frequency components of the first pulse signal. Thus, the signal wave corresponding to the second pulse signal may be generated by applying, to the load circuit, the high-frequency components of the first pulse signal extracted by the extraction circuit.

The extraction circuit may be a differentiation circuit.

The signal-wave generation circuit may further include a buffer connected to the input of the extraction circuit.

The load varying circuit may include a second transistor that functions as a switch which is switched in accordance with the first pulse signal applied to the base thereof, may vary an emitter load by disconnecting, from the load circuit, a predetermined element, which serves as a portion of an emitter load when the second transistor is turned off and by connecting the disconnected element to the load circuit when the second transistor is turned on. The signal-wave generation circuit may further include an inverter circuit connected to the input of the extraction circuit.

The inverter circuit may be formed of a third transistor which functions as a switch, and a resistor.

The inverter circuit may include, as the third transistor, a set of an NPN-type transistor and a PNP-type transistor.

The inverter circuit may further include a Schottky diode connected between the base and the collector of each of the NPN-type transistor and the PNP-type transistor.

There may be a plurality of the first transistors, and an emitter resistor differing from the resistor which forms the load circuit may be connected to the emitter of one or more of first predetermined transistor among the plurality of first transistors. The signal-wave generation circuit may apply the signal wave corresponding to the second pulse signal such that the waveform of the first pulse signal is shaped, to the emitter of the first transistor excluding some transistors such that the emitter is connected to the emitter resistor among the plurality of first transistors.

In another aspect, the present invention provides a first modulation method for use with a modulation circuit, having a transistor, which amplitude-modulates digital data transmitted via an antenna including a resonance circuit, for amplitude-modulating a carrier wave applied to the base of the transistor into an amplitude-modulated wave in accordance with a signal wave applied to the emitter of the transistor and for supplying the amplitude-modulated wave to the antenna via the collector of the transistor, the modulation method including the steps of: inputting a first pulse signal in a rectangular waveform corresponding to the digital data; generating the signal wave in such a manner as to correspond to a second pulse signal whose waveform is shaped so that the level at each rise time of each pulse of the first input pulse signal becomes higher than the high level in a steady state of the first pulse signal and the level at each fall time of each pulse of the first input pulse signal becomes lower than the low level in the steady state of the first pulse signal; and applying the generated signal wave to the emitter of the transistor.

In the first electronic circuit and the first modulation method of the present invention, a first pulse signal in a rectangular waveform corresponding to digital data is input. Then, a signal wave is generated in such a manner as to correspond to a second pulse signal whose waveform is shaped so that the level at each rise time of each pulse of the first input pulse signal becomes higher than the high level in a steady state of the first pulse signal and the level at each fall time of each pulse of the first input pulse signal becomes lower than the low level in the steady state of the first pulse signal. When the generated signal wave is applied to the emitter of the transistor, a carrier wave applied to the base of the transistor is amplitude-modulated into an amplitude-modulated wave in accordance with a signal wave corresponding to the second pulse signal applied to the emitter of the transistor. The amplitude-modulated wave is supplied to an antenna including a resonance circuit via the collector of the transistor, and an electromagnetic wave based on the supplied amplitude-modulated wave is transmitted from the antenna.

The first electronic circuit of the present invention may be used as a single device or may be incorporated as a portion of an information processing device. That is, for example, the first electronic circuit may be used as a transmission section of an information processing device for transmitting and receiving digital data, and the first electronic circuit may be used as a wireless transmission section of an information processing device capable of performing both wired and wireless communications.

In another aspect, the present invention provides a second electronic circuit for amplitude-modulating digital data transmitted via an antenna including a resonance circuit, the electronic circuit including: a modulation circuit, having a field-effect transistor, for amplitude-modulating a carrier wave applied to the gate of the field-effect transistor into an amplitude-modulated wave in accordance with a signal wave applied to the source of the field-effect transistor and for supplying the amplitude-modulated wave to the antenna via the drain of the field-effect transistor; and a signal-wave generation circuit for inputting a first pulse signal in a rectangular waveform corresponding to the digital data, for generating the signal wave in such a manner as to correspond to a second pulse signal whose waveform is shaped so that the level at each rise time of each pulse of the first input pulse signal becomes higher than the high level in a steady state of the first pulse signal and the level at each fall time of each pulse of the first input pulse signal becomes lower than the low level in the steady state of the first pulse signal, and for applying the generated signal wave to the source of the field-effect transistor.

In another aspect, the present invention provides a second modulation method for use with a modulation circuit, having a field-effect transistor, which amplitude-modulates digital data transmitted via an antenna including a resonance circuit, for amplitude-modulating a carrier wave applied to the gate of the field-effect transistor into an amplitude-modulated wave in accordance with a signal wave applied to the source of the field-effect transistor and for supplying the amplitude-modulated wave to the antenna via the drain of the field-effect transistor, the modulation method including the steps of: inputting a first pulse signal in a rectangular waveform corresponding to the digital data; generating the signal wave in such a manner as to correspond to a second pulse signal whose waveform is shaped so that the level at each rise time of each pulse of the first input pulse signal becomes higher than the high level in the steady state of the first pulse signal and the level at each fall time of each pulse of the first input pulse signal becomes lower than the low level in the steady state of the first pulse signal; and applying the generated signal wave to the source of the field-effect transistor.

In the second electronic circuit and the second modulation method of the present invention, a first pulse signal in a rectangular waveform corresponding to digital data is input. Then, a signal wave is generated which corresponds to a second pulse signal whose waveform is shaped so that the level at each rise time of each pulse of the first input pulse signal becomes higher than the high level in a steady state of the first signal and the level at each fall time of each pulse of the first input pulse signal becomes lower than the low level in the steady state of the first signal. When the generated signal wave is applied to the source of the field-effect transistor, a carrier wave applied to the gate of the field-effect transistor is amplitude-modulated into an amplitude-modulated wave in accordance with the signal wave corresponding to the second pulse signal applied to the source of the field-effect transistor. The amplitude-modulated wave is supplied to an antenna including a resonance circuit via the drain of the field-effect transistor, and an electromagnetic wave based on the supplied amplitude-modulated wave is transmitted from the antenna.

The second electronic circuit of the present invention may be used as a single device or may be incorporated as a portion of an information processing device. That is, for example, the second electronic circuit may be used as a transmission section of an information processing device for transmitting and receiving digital data, and the second electronic circuit may be used as a wireless transmission section of an information processing device capable of performing both of wired and wireless communications.

In another aspect, the present invention provides an information processing device for amplitude-modulating first digital information and transmitting the information, the information processing device including: modulation means, having a transistor, for amplitude-modulating a carrier wave applied to the base of the transistor into an amplitude-modulated wave in accordance with a signal wave which corresponds to the first information, the signal wave being applied to the emitter of the transistor, and for outputting the amplitude-modulated wave via the collector of the transistor; first output means for outputting the carrier wave applied to the base of the transistor; second output means for outputting a first pulse signal in a rectangular waveform corresponding to the first information; signal-wave generation means for generating the signal wave in such a manner as to correspond to a second pulse signal whose waveform is shaped so that the level at each rise time of each pulse of the first pulse signal output from the second output means becomes higher than the high level in a steady state of the first pulse signal and the level at each fall time of each pulse of the first pulse signal becomes lower than the low level in the steady state of the first pulse signal, and for applying the generated signal wave to the emitter of the first transistor; and antenna means, having a resonance circuit, for transmitting an electromagnetic wave based on the amplitude-modulated wave output from the modulation means to another information processing device.

The information processing device may further include detection means for detecting varied components of the waveform corresponding to the second digital information which is transmitted from the other information processing device and which is received by the antenna means; and demodulation means for demodulating the signal corresponding to the second digital information from the varied components of the waveform detected by the detection means.

The other information processing device may be an IC card capable of non-contact communication, and the information processing device may be a reader/writer device that writes the first information into the IC card and reads the second information from the IC card by performing non-contact communication with the IC card via the antenna means.

In another aspect, the present invention provides an information processing method for use with an information processing device including a modulation circuit, having a transistor, for amplitude-modulating a carrier wave applied to the base of the transistor into an amplitude-modulated wave in accordance with a signal wave, which corresponds to digital information to be transmitted, applied to the emitter of the transistor and for outputting the amplitude-modulated wave via the collector of the transistor; and an antenna, having a resonance circuit, for transmitting an electromagnetic wave based on the amplitude-modulated wave output from the modulation circuit to another information processing device, the information processing method including the steps of: outputting the carrier wave applied to the base of the transistor; outputting a first pulse signal in a rectangular waveform corresponding to the digital information; generating the signal wave in such a manner as to correspond to a second pulse signal whose waveform is shaped so that the level at each rise time of each pulse of the first pulse signal becomes higher than the high level in a steady state of the first pulse signal and the level at each fall time of each pulse of the first pulse signal becomes lower than the low level in the steady state of the first pulse signal; and applying the generated signal wave to the emitter of the first transistor.

In the information processing device and the information processing method of the present invention, a first pulse signal in a rectangular waveform corresponding to digital data is input. Then, a signal wave is generated in such a manner as to correspond to a second pulse signal whose waveform is shaped so that the level at each rise time of each pulse of the first input pulse signal becomes higher than the high level in a steady state of the first pulse signal and the level at each fall time of each pulse of the first input pulse signal becomes lower than the low level in a steady state of the first signal. When the generated signal wave is applied to the emitter of the transistor, the carrier wave applied to the base of the transistor is amplitude-modulated into an amplitude-modulated wave in accordance with a signal wave corresponding to the second pulse signal applied to the emitter of the transistor. The amplitude-modulated wave is supplied to an antenna including a resonance circuit via the collector of the transistor, and an electromagnetic wave based on the supplied amplitude-modulated wave is transmitted from the antenna.

The information processing device may be a device which only transmits digital data or may be a device which is capable of transmitting and receiving digital data. The data which can be transmitted and received by the information processing device of the present invention may be only digital or may be both analog and digital. Furthermore, the information processing device of the present invention may be a device which simply performs communication wirelessly or may be a device which is capable of performing both of wired and wireless communications.

As described above, according to the present invention, digital data to be transmitted via an antenna including a resonance circuit can be amplitude-modulated. In particular, the digital data can be amplitude-modulated in such a manner as to reduce the frequency of occurrence of communication failures at the receiving side.

Furthermore, according to the present invention, digital data can be transmitted via an antenna including a resonance circuit on the basis of amplitude modulation. In particular, transmission in which the frequency of occurrence of communication failures at the receiving side is reduced can be performed.

DESCRIPTION OF THE PREFERRED EMBODIMENTS

The applicant of the present application has analyzed the reasons why the above-described conventional problems occur, and devised the present invention on the basis of the analysis results. Therefore, first, the analysis results, that is, the reasons why the above-described conventional problems occur, will be described.

Figure 2:
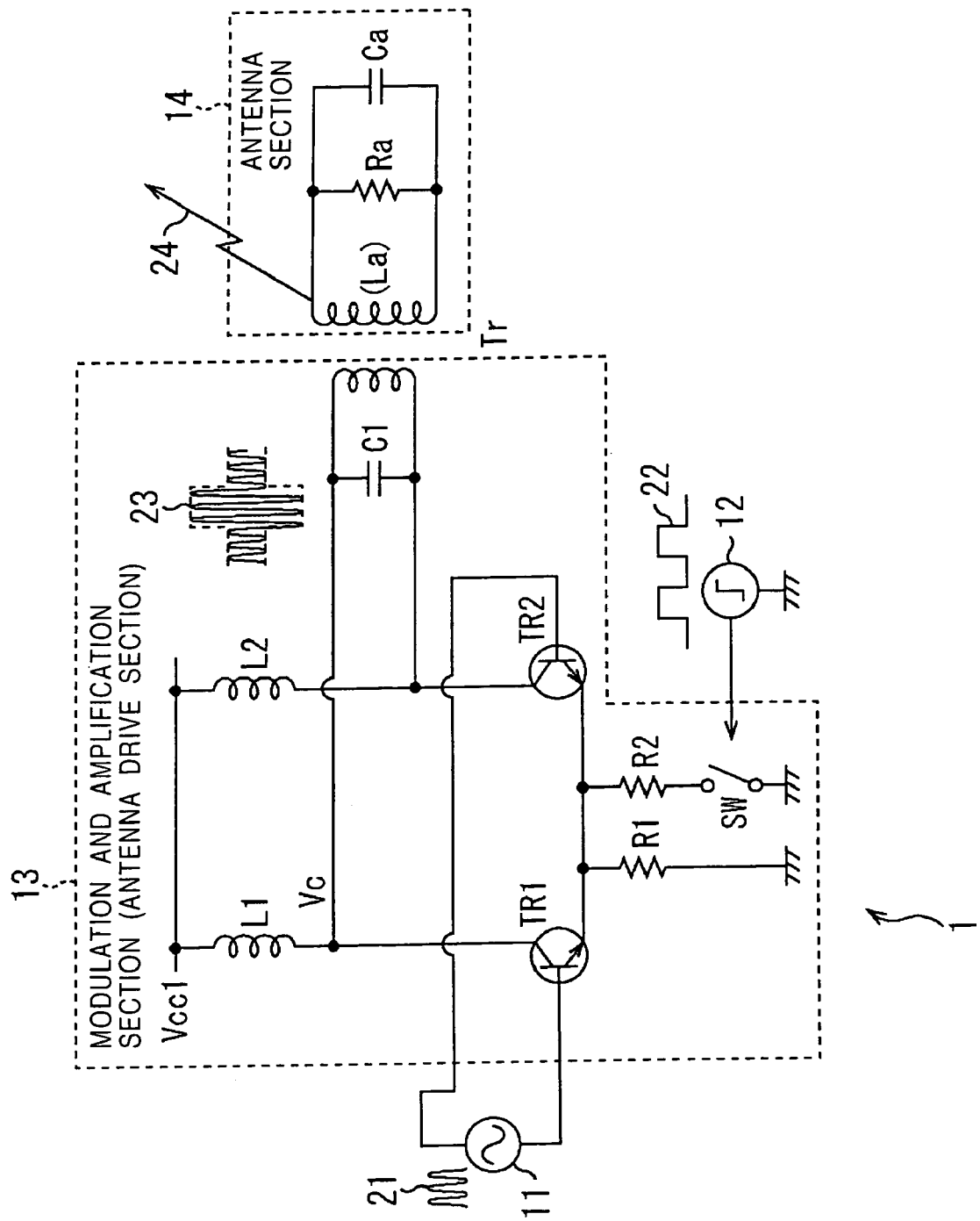
FIG. 2 is a circuit diagram showing a specific example of the configuration of the transmission device of FIG. 1.
Figure 3:
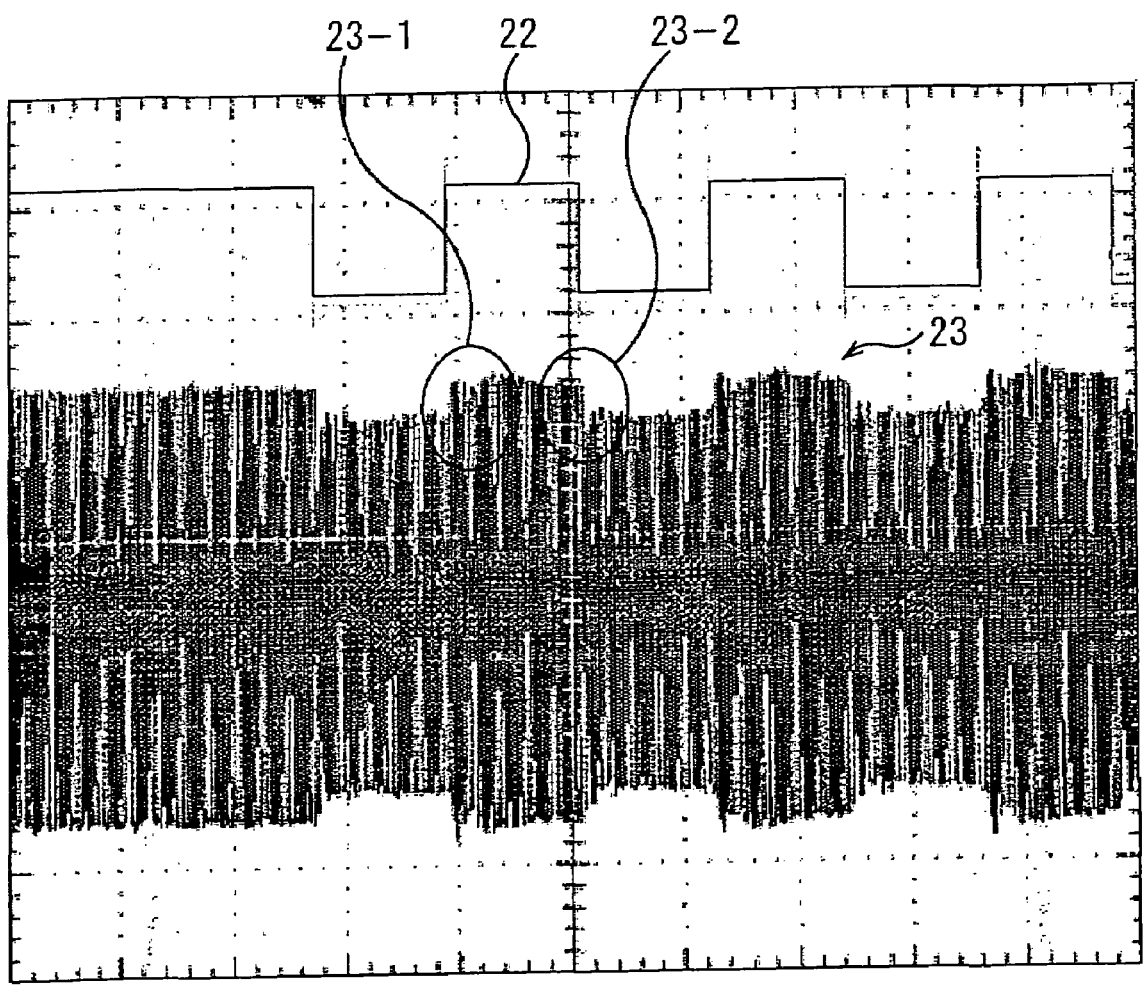
FIG. 3 is a measurement chart of a collector voltage (amplitude-modulated wave) of the transmission device of FIG. 2.
Figure 4:
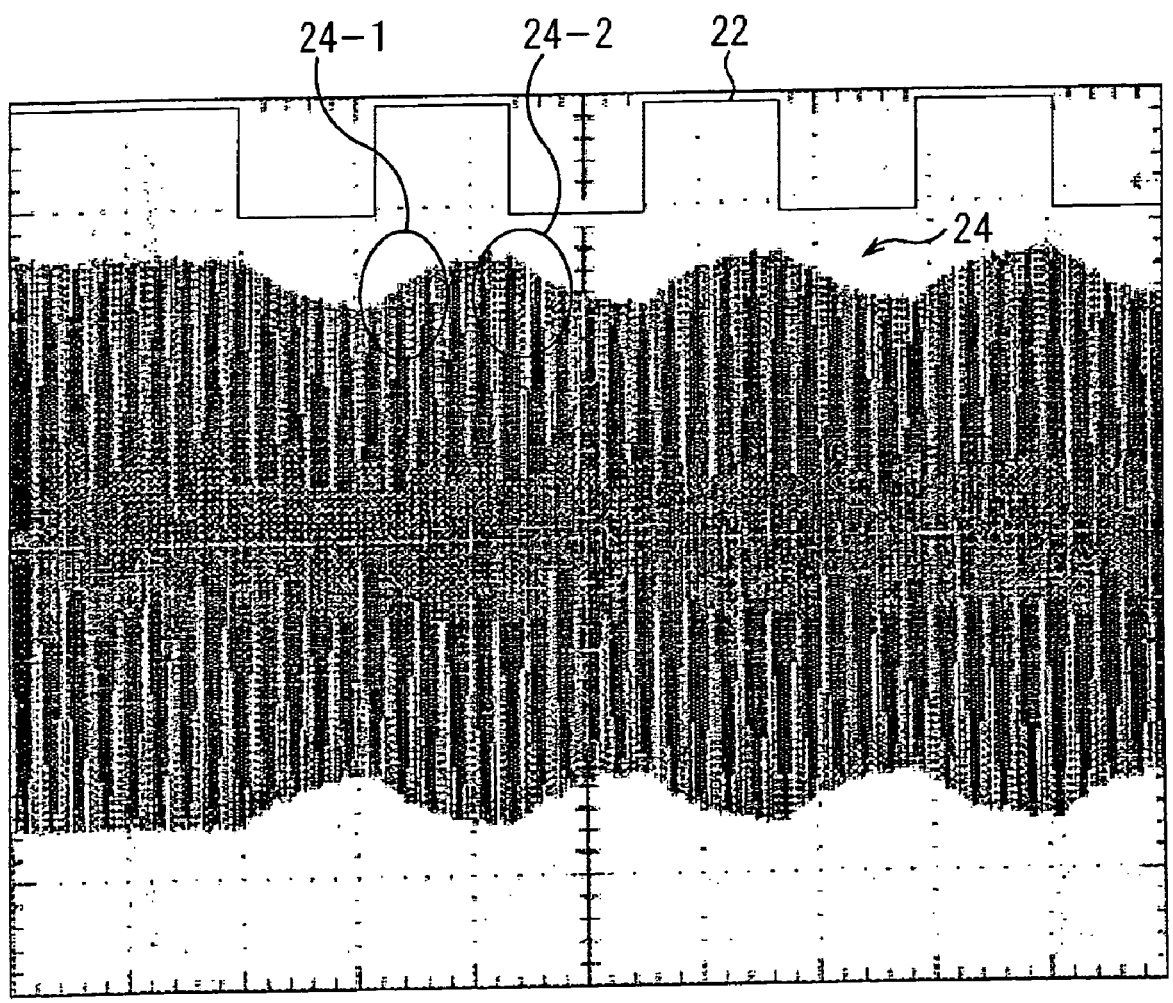
FIG. 4 is a measurement chart of a magnetic flux (electromagnetic wave) output from an antenna section of the transmission device of FIG. 2.

By using the conventional transmission device 1 of FIG. 2, the applicant of the present application measured the collector voltage Vc (amplitude-modulated wave 23), and the magnetic flux (electromagnetic wave) 24 output from the antenna section 14 in a case where the pulse signal 22 was actually input from the transmission data output section 12. The measurement results are shown in FIGS. 3 and 4. That is, FIG. 3 shows a measurement chart of the pulse signal 22 and the collector voltage Vc (amplitude-modulated wave 23) in the transmission device 1 of FIG. 2, and FIG. 4 shows a measurement chart of the pulse signal 22 and the magnetic flux (electromagnetic wave) 24 output from the antenna section 14.

As shown in FIG. 3, the collector voltage Vc (amplitude-modulated wave 23) for driving the antenna section 14 follows the pulse signal 22. For example, as indicated at a changed portion 23-1, at the rise time of a pulse of the pulse signal 22 (when shifting from a low level to a high level), the amplitude of the collector voltage Vc (amplitude-modulated wave 23) also instantaneously changes from a low level to a high level in such a manner as to follow that shift. Similarly, as indicated at a changed portion 23-2, at the fall time of a pulse of the pulse signal 22 (when shifting from a high level to a low level), the amplitude of the collector voltage Vc (amplitude-modulated wave 23) also instantaneously changes from a high level to a low level in such a manner as to follow that shift.

However, as shown in FIG. 4, the magnetic flux (electromagnetic wave) 24 output from the antenna section 14 does not instantaneously follow the pulse signal 22, but varies with a delay with respect to the change of the pulse signal 22. For example, as indicated at a changed portion 24-1, at the rise time of the pulse of the pulse signal 22, the magnetic flux (electromagnetic wave) 24 does not instantaneously follow it, and the shift from the low level to the high level of the amplitude of the magnetic flux (electromagnetic wave) 24 becomes a waveform in a first-order delay manner. Similarly, as indicated at a changed portion 24-2 of the electromagnetic wave 24, at the fall time of the pulse of the pulse signal 22, the magnetic flux (electromagnetic wave) 24 does not instantaneously follow it, and the shift from the high level to the low level of the amplitude of the magnetic flux (electromagnetic wave) 24 becomes a waveform in a first-order delay manner.

Figure 5:
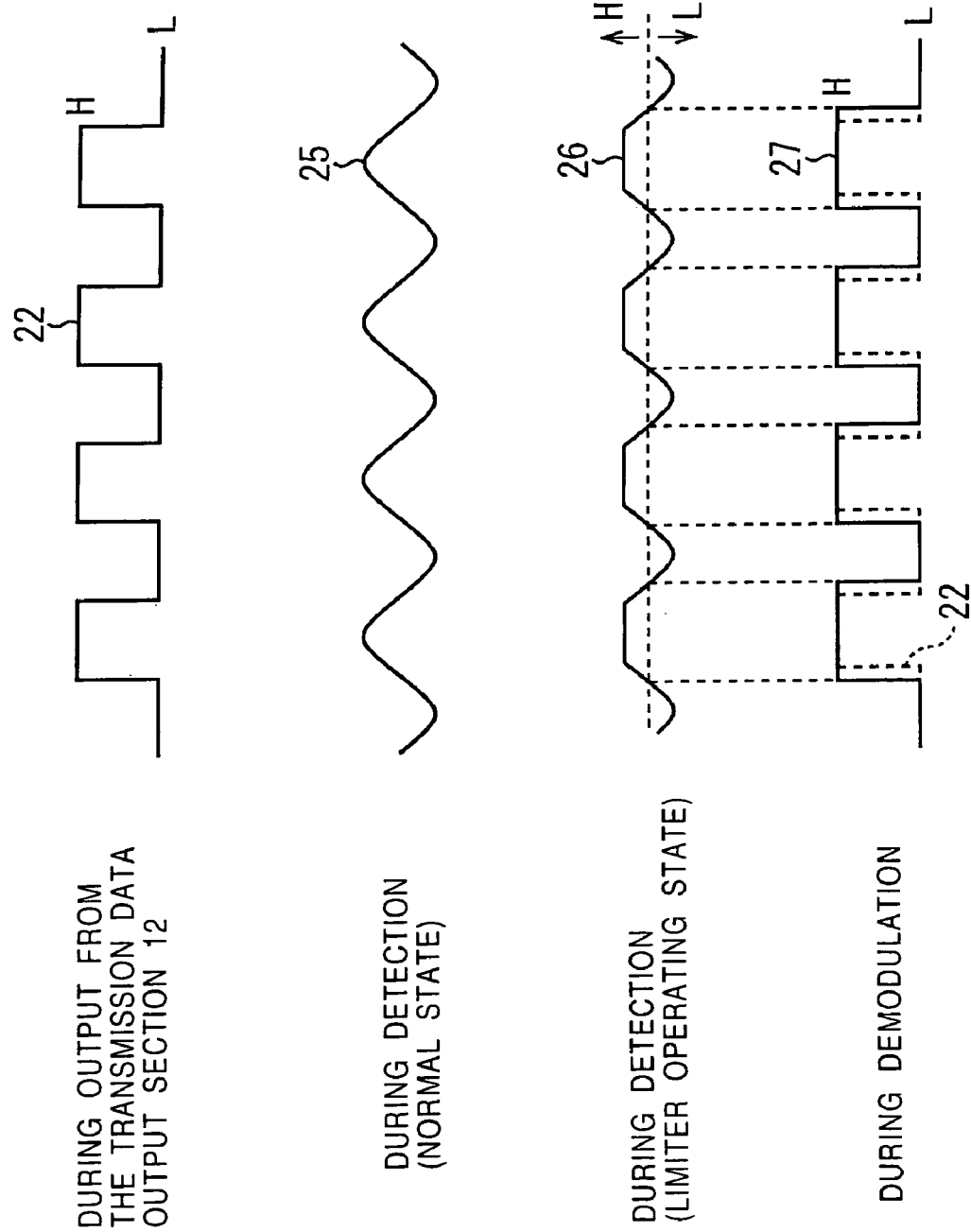
FIG. 5 illustrates an example of a waveform when digital data transmitted from the transmission device of FIG. 2 is demodulated at the receiving side.

After the magnetic flux (electromagnetic wave) 24, such as that shown in FIG. 4, is transmitted from the antenna section 14, when it is received and detected by a receiving device (not shown) in a normal state, a waveform 25 shown in FIG. 5 is detected. Although not shown, the detected waveform 25 can be demodulated in a form closer to the pulse signal 22 corresponding to the transmission data.

In contrast, when the receiving device is, for example, an IC card (not shown), such as that described above, having a limiter for limiting the input, that is, in a limiter operating state, a waveform 26 shown in FIG. 5 is detected. As shown in FIG. 5, when the detected waveform 26 is higher than a predetermined level (the dotted line drawn in the waveform 26 in FIG. 5) in a comparator, the detected waveform 26 reaches a high level (hereinafter also referred to as "H"), and when it is lower than the predetermined level (hereinafter also referred to as "L"), the detected waveform 26 reaches a low level, thereby a signal 27 shown in FIG. 5 is demodulated. As shown in FIG. 5, this demodulated signal 27 becomes a signal which differs greatly from the original signal (pulse signal 22), and as a result, communication failure occurs.

In the manner described above, the reason why the above-described problems occur is that the magnetic flux (electromagnetic wave) 24 output from the antenna section 14 of FIG. 2 does not instantaneously follow the pulse signal 22 corresponding to the transmission data, but varies with a delay.

The mechanism by which the delay of the magnetic flux (electromagnetic wave) 24 occurs will be described below.

When the resonance circuit of the antenna section 14 is in a resonance state, the antenna section 14 has stored therein energy in the form of resonance current (hereinafter such energy will be referred to as "resonance energy"), and unless energy is given by the antenna drive section 13 (modulation and amplification section 13), the resonance energy is consumed after a finite period of time.

In other words, the antenna drive section 13 drives the antenna section 14 by providing predetermined energy to the antenna section 14 (hereinafter such energy will be referred to as "drive energy" so as to distinguish it from the resonance energy).

The higher the Q factor (Quality Factor) of the antenna of the antenna section 14, the more time it takes to consume the resonance energy.

Therefore, if a signal of a predetermined level is output instead of the pulse signal 22 from the transmission data output section 12, the amplitude of the collector voltage Vc becomes fixed, stabilization is achieved in a state in which the loss in the resonance circuit of the antenna section 14 and the drive energy are equal to each other, the resonance current becomes fixed, and as a result, the amplitude of the magnetic flux (electromagnetic wave) 24 to be output becomes fixed.

In contrast, in the manner described above, since the actual signal output from the transmission data output section 12 is the pulse signal 22, the amplitude of the collector voltage Vc (amplitude-modulated wave 23) is also varied. It is assumed here that the amplitude of the collector voltage Vc varies in such a manner as to instantaneously follow the pulse signal 22. In this case, for example, at the rise time of the pulse of the pulse signal 22, that is, when the amplitude of the collector voltage Vc shifts from a low level to a high level, the drive energy increases and becomes larger than the loss, and the resonance current varies in an increasing direction. Thereafter, when stabilization is achieved in a state in which the increased drive energy and the loss are equal to each other, the resonance current becomes fixed. As a result, the amplitude of the magnetic flux (electromagnetic wave) 24 to be output also becomes fixed at a predetermined level (high level) higher than the level before change (low level).

However, since the resonance energy is Q times as large as the loss, a fixed time is required for the stabilized state (a state in which the increased drive energy and the loss are equal to each other) to be reached. As a result, the magnetic flux (electromagnetic wave) 24 output from the antenna section 14 varies with a delay with respect to the pulse signal 22 corresponding to the transmission data. That is, it takes a fixed time (is delayed) from the rise time of the pulse of the pulse signal 22 for the amplitude of the magnetic flux (electromagnetic wave) 24 to reach the high level from the low level.

For the same reasons, it takes a fixed time (is delayed) from the fall time of the pulse of the pulse signal 22 for the amplitude of the magnetic flux (electromagnetic wave) 24 to reach the low level from the high level.

Figure 6:
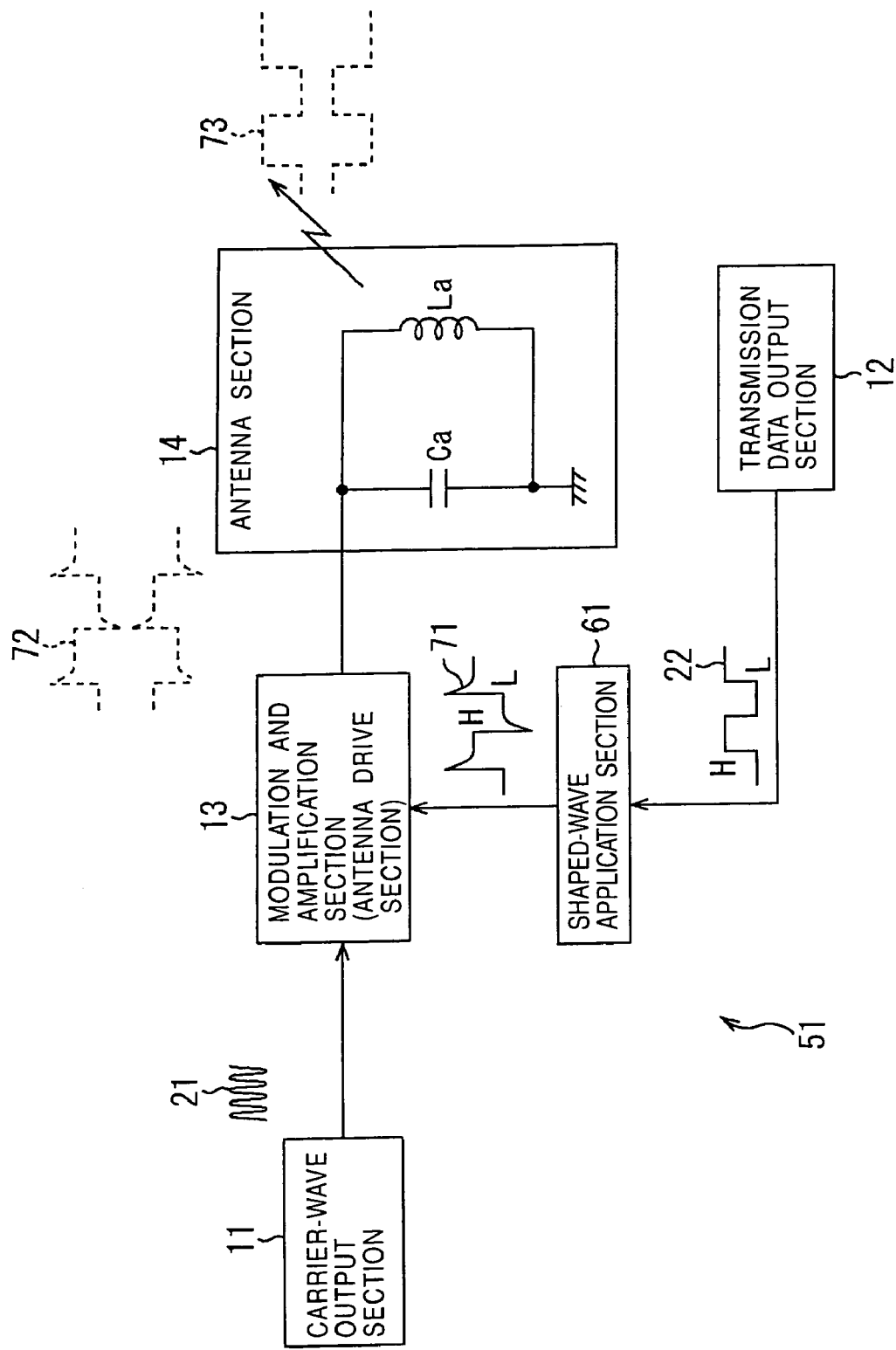
FIG. 6 is a block diagram showing an example of the configuration of a transmission device to which the present invention is applied.

Accordingly, as a technique for eliminating such a delay of the magnetic flux (electromagnetic wave) 24, that is, as a technique for solving the above-described conventional problems, the applicant of the present application has devised a technique for strengthening the changed portion of the drive energy (the portions corresponding to the rise and fall of the pulse of the pulse signal 22) when the signal corresponding to the transmission data is a signal that changes like the pulse signal 22, and has further devised a transmission device such as that shown in FIG. 6 on the basis of such a technique. That is, FIG. 6 shows an example of the configuration of a transmission device to which the present invention is applied.

Figure 1:
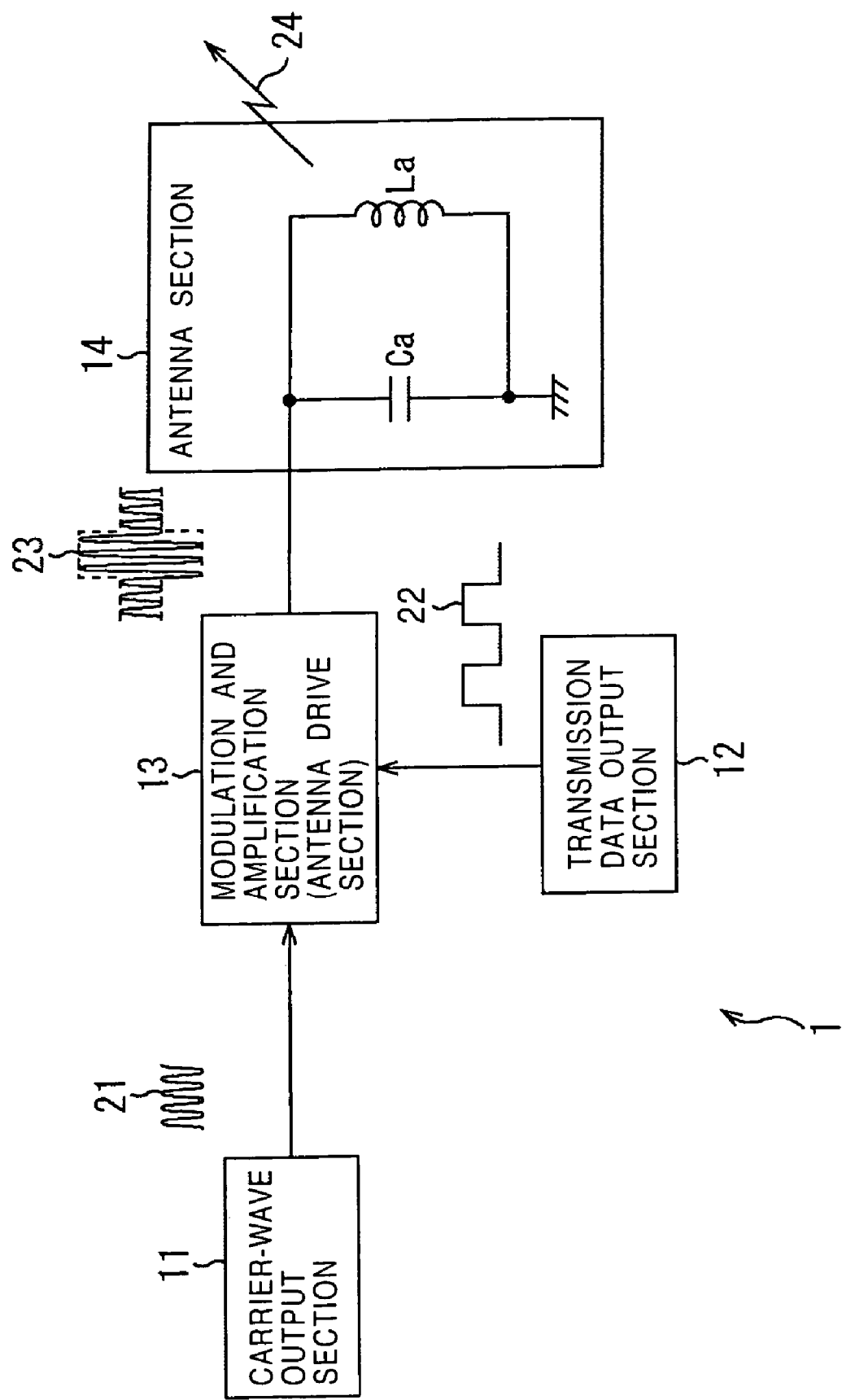
FIG. 1 is a block diagram showing an example of the configuration of a conventional transmission device.

In a transmission device 51 of FIG. 6, components which correspond to those of the conventional transmission device (FIG. 1) are designated with the corresponding reference numerals, and descriptions thereof are omitted where appropriate.

As shown in FIG. 6, when compared to the conventional transmission device 1, the transmission device 51 further includes a shaped-wave application section 61 between the transmission data output section 12 and the modulation and amplification section (antenna drive section) 13.

More specifically, conventionally (in FIG. 1), as described above, a signal wave corresponding to the pulse signal 22 itself output from the transmission data output section 12 is applied to the modulation and amplification section 13, and as a result, the amplitude-modulated wave 23 is output from the modulation and amplification section 13. In this case, as described above, when the drive energy corresponding to the amplitude-modulated wave 23 is supplied to the antenna section 14, a delay occurs in the electromagnetic wave (magnetic flux) 24 output from the antenna section 14.

Therefore, in the transmission device 51 of FIG. 6, the shaped-wave application section 61 inputs the first pulse signal 22 in a rectangular waveform corresponding to the transmission data, output from the transmission data output section 12; generates a signal wave in such a manner as to correspond to a second pulse signal 71 whose waveform is shaped so that the level at each rise time of each pulse of the first input pulse signal 22 becomes higher than the high level (H) in the steady state of the first pulse signal 22 and the level at each fall time of each pulse of the first input pulse signal 22 becomes lower than the low level (L) in the steady state of the first pulse signal 22; and applies the generated signal wave to the modulation and amplification section 13.

As a result, the carrier wave 21 output from the carrier-wave output section 11 is amplitude-modulated and amplified in accordance with the signal wave corresponding to the second pulse signal 71 by means of the modulation and amplification section 13, forming an amplitude-modulated wave 72 in which the amplitude varied portion is strengthened (in FIG. 6, the actual modulation wave is omitted, and only the amplitude varied portion is drawn), and the drive energy corresponding to the amplitude-modulated wave 72 is supplied to the antenna section 14. As a result, an electromagnetic wave 73 (in FIG. 6, the actual electromagnetic wave is omitted, and only the amplitude varied portion is drawn), whose amplitude level follows almost instantaneously the change of the pulse signal 22 (the rise and fall of the pulse), is output from the antenna section 14.

In the manner described above, in the transmission device 51 of FIG. 6, since the change of the electromagnetic wave 73 output from the antenna section 14 becomes faster, it is possible to reduce the frequency of occurrence of the communication failures described above at the receiving side. That is, the conventional problems can be solved.

The configuration of the shaped-wave application section 61 is not particularly limited as long as the configuration is capable of applying, to the modulation and amplification section 13, a signal wave corresponding to the second pulse signal 71 such that the waveform of the first pulse signal 22 is shaped. In this example, the shaped-wave application section 61 has a configuration shown in FIG. 7, for example.

Figure 7:
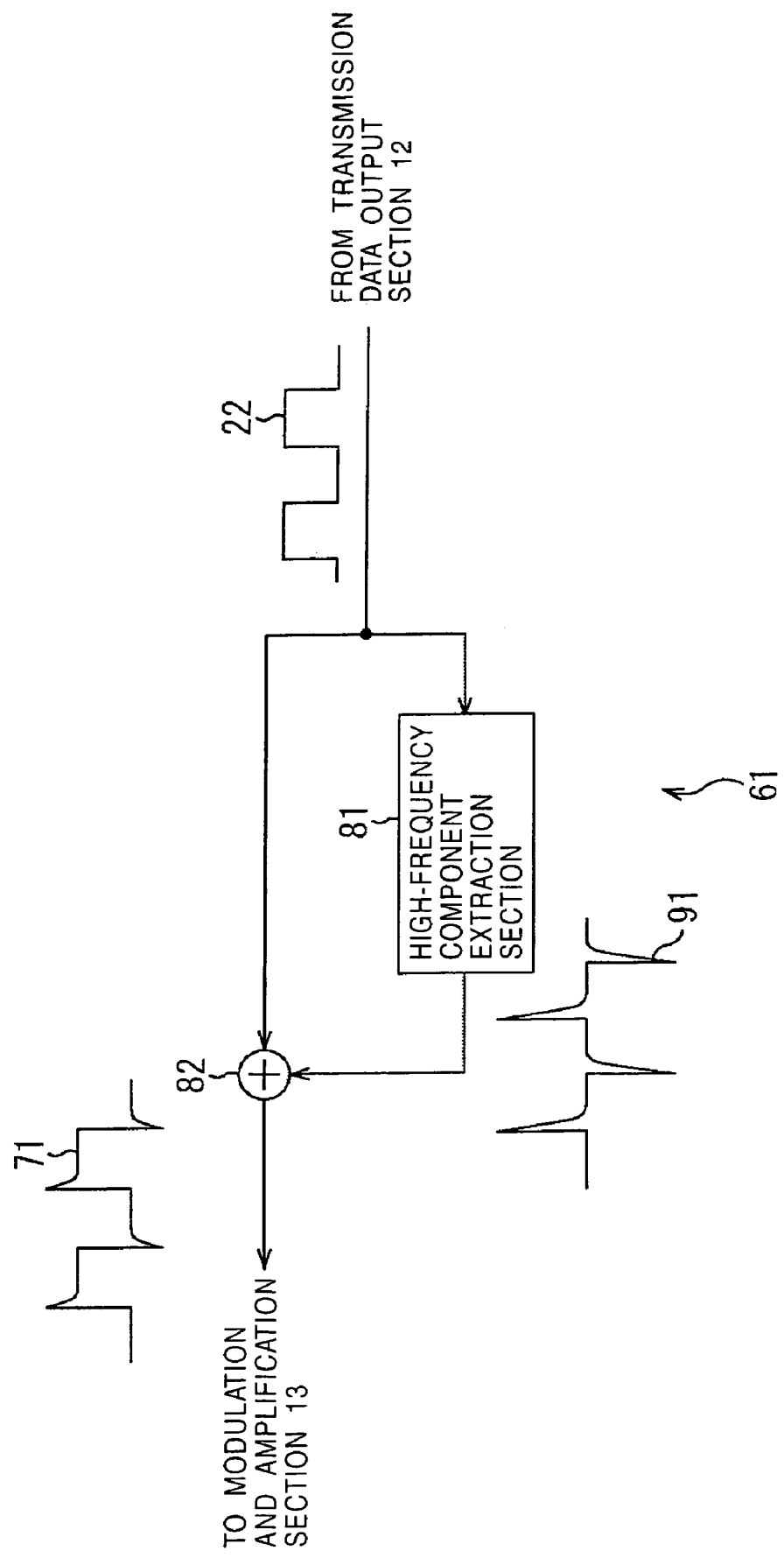
FIG. 7 is a block diagram showing a detailed example of the configuration of a shaped-wave application section of the transmission device of FIG. 6.

More specifically, as shown in FIG. 7, the shaped-wave application section 61 includes a high-frequency component extraction section 81 for extracting high-frequency components 91 of the first pulse signal 22 output from the transmission data output section 12; and an application section 82 for outputting a signal wave corresponding to the second pulse signal 71 such that the high-frequency components 91 of the first pulse signal 22 extracted by the high-frequency component extraction section 81 are applied to the first pulse signal 22 output from the transmission data output section 12.

Figure 8:
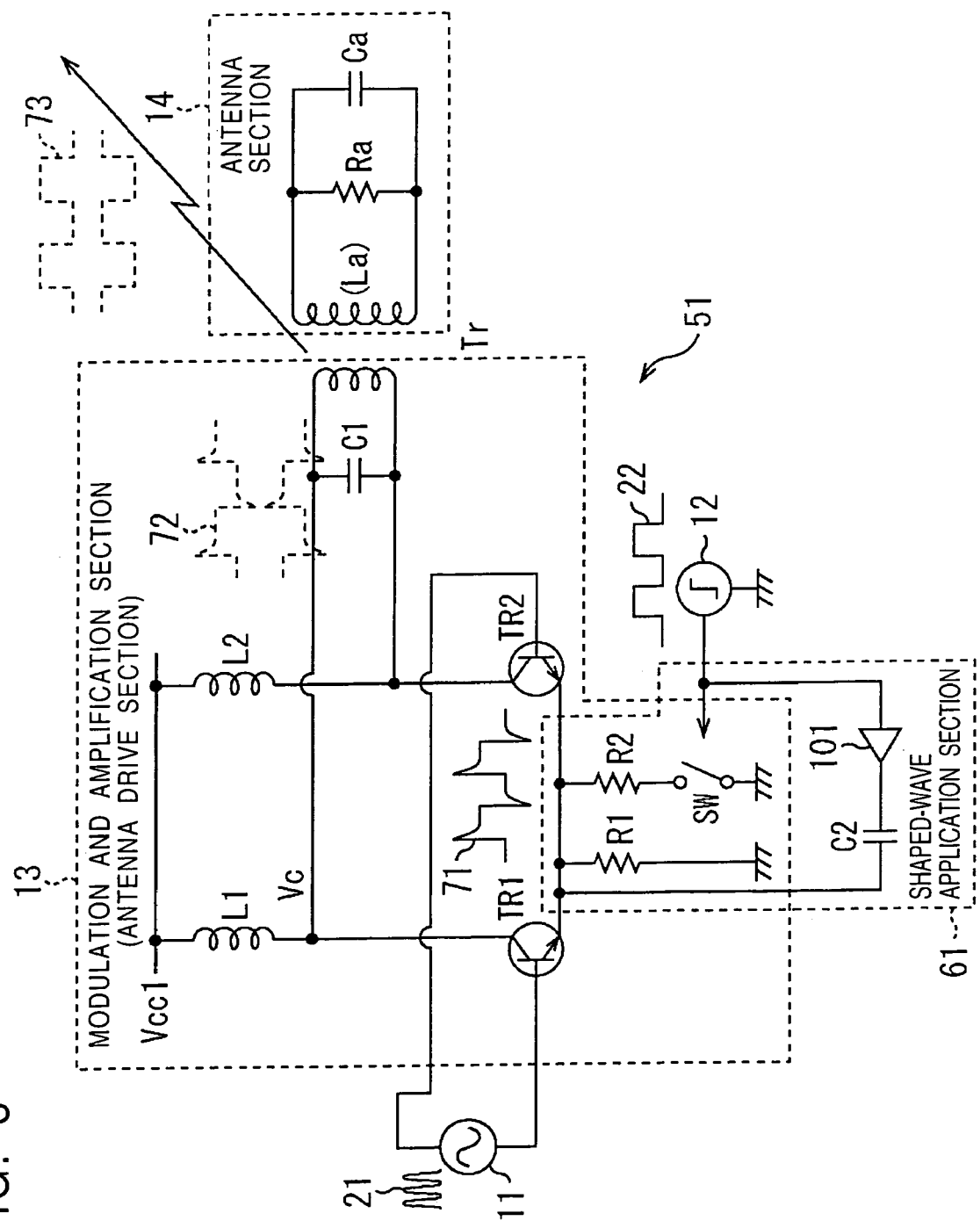
FIG. 8 is a circuit diagram showing a specific example of the configuration of the transmission device of FIG. 6.
Figure 9:
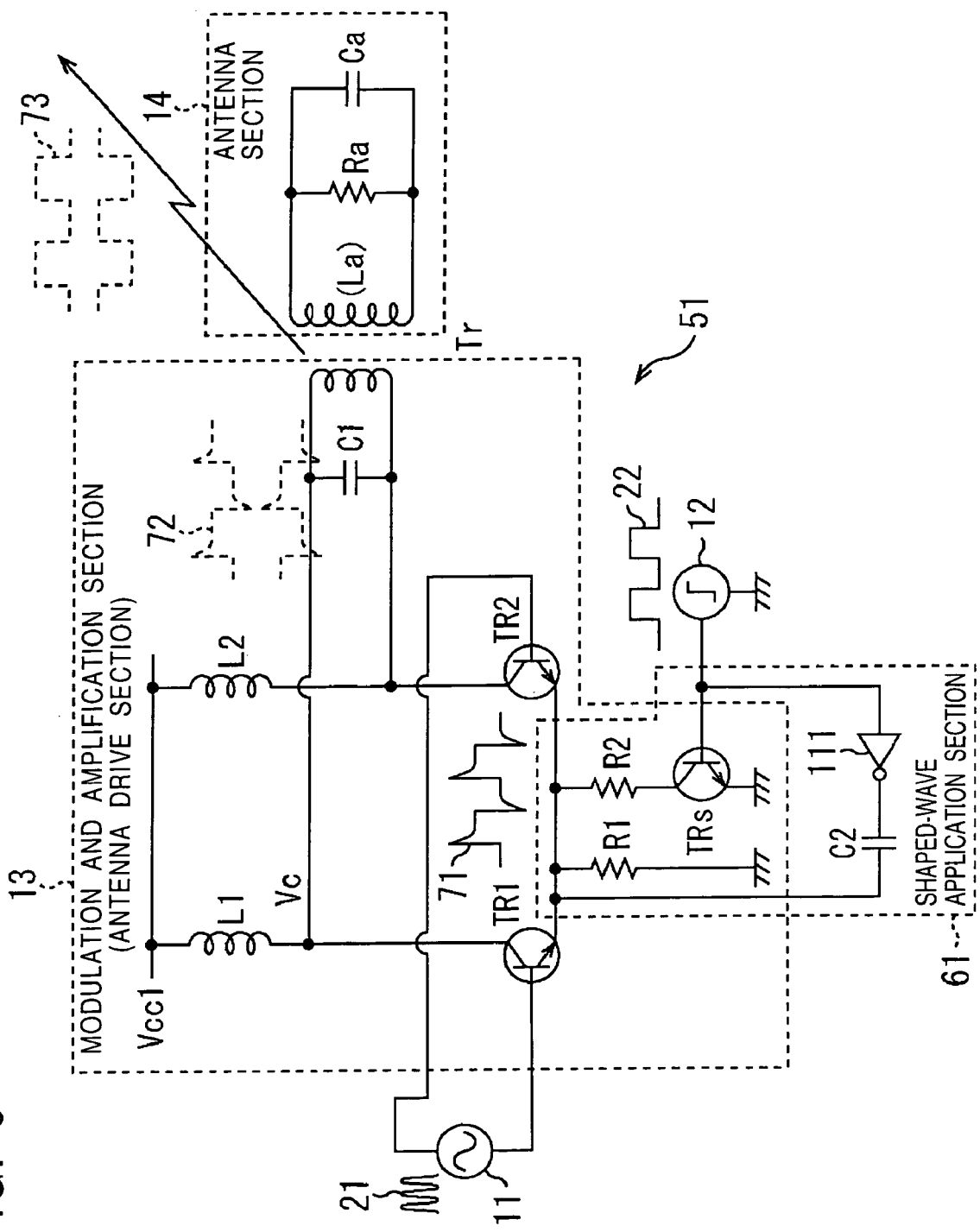
FIG. 9 is a circuit diagram showing another specific example of the configuration of the transmission device of FIG. 6.

More specifically, the transmission device 51 of FIG. 6 can be configured as shown in, for example, FIG. 8 or 9. In the transmission device 51 of FIGS. 8 and 9, components which correspond to the conventional transmission device 1 in FIG. 2 are designated with the corresponding reference numerals, and descriptions thereof are omitted where appropriate.

In FIG. 8, when compared to the transmission device 1 of FIG. 2, in the transmission device 51, furthermore, a series circuit in which a capacitor C2 and a buffer 101 are connected in series is connected between the emitters of the transistor TR1 and the transistor TR2, and the transmission data output section 12.

More specifically, in the example of FIG. 8, the shaped-wave application section 61 is formed of the capacitor C2, the buffer 101, a resistor R1 and a resistor R2, which serve as emitter loads and which are also used in the conventional modulation and amplification section 13, and a switch SW for changing the emitter load.

A differentiation circuit formed of the capacitor C2 and the emitter load (a variable load formed of the resistor R1 and the resistor R2) corresponds to the high-frequency component extraction section 81 of FIG. 7.

The buffer 101 is provided for the purpose of the following. That is, when the switch SW is, for example, a transistor, since the transmission data output section 12, which is a signal source of the pulse signal 22, has a finite output impedance, if the transmission data output section 12 is directly connected to the emitter load, a problem arises in that the change of the transistor which functions as the switch SW is delayed. Therefore, in the example of FIG. 8, in order to solve this problem, the buffer 101 is provided between the transmission data output section 12 and the capacitor C2.

The switch SW for changing the emitter load is not particularly limited, and, for example, an NPN-type transistor can be used. In this case, as shown in FIG. 9, one end of the resistor R1 whose other end is grounded is connected to the emitters of the transistor TR1 and the transistor TR2, and one end of the resistor R2 whose other end is also connected to the collector of the transistor TRs is connected thereto. Furthermore, the transmission data output section 12 is connected to the base of the transistor TRs, and the emitter thereof is grounded.

However, in a case where, as a switch, an NPN-type transistor TRs is used, at the moment the pulse signal 22 applied to the base of the transistor TRs reaches a high level (H) (at the rise time of the pulse), it is required that the electrical current of the transistor TR1 and the transistor TR2 of the modulation and amplification section 13 be increased. This corresponds to a situation where negative pulse components are applied to the emitter loads of the transistor TR1 and the transistor TR2. This can be realized by converting the pulse signal 22 output from the transmission data output section 12 by using an inverter and thereafter, by causing the signal to be passed through a high-pass filter. More specifically, in place of the buffer 101 of FIG. 8, an inverter 111 may be provided, as shown in FIG. 9.

Figure 10:
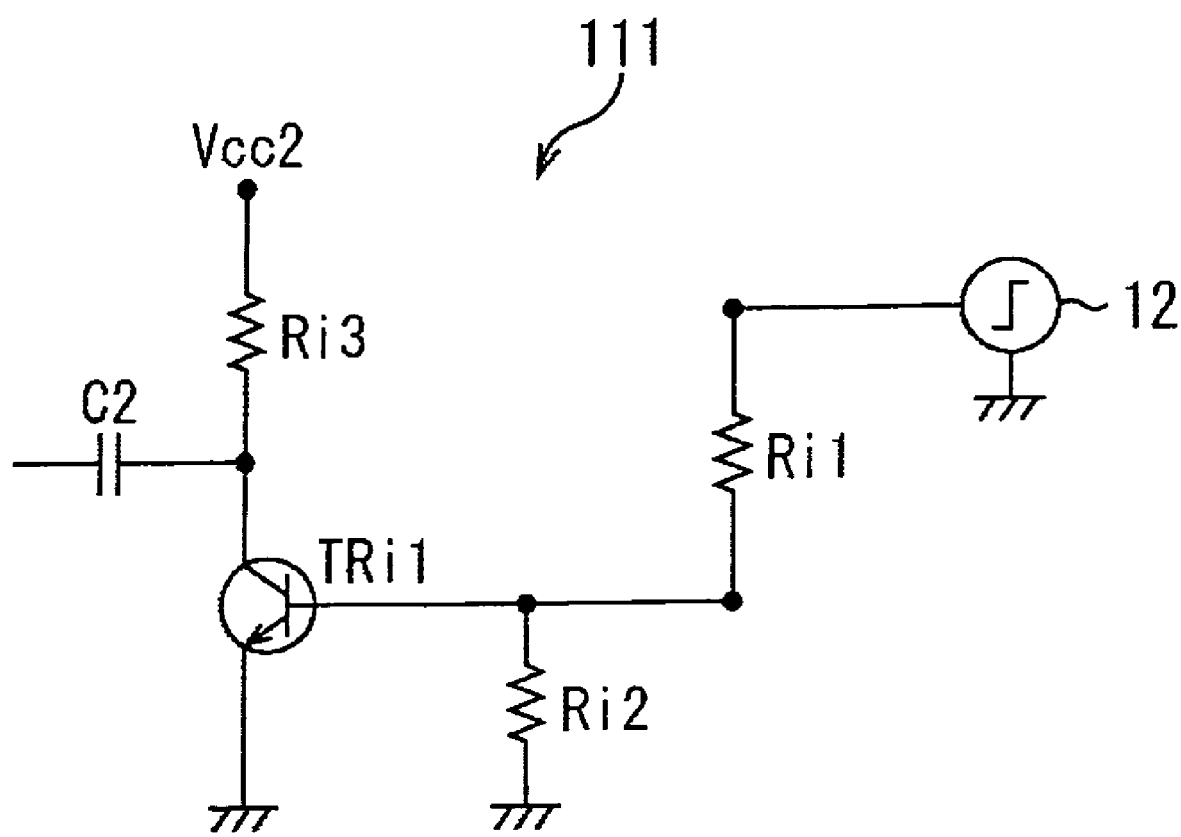
FIG. 10 is a circuit diagram showing a specific example of the configuration of an inverter of the transmission device of FIG. 9.
Figure 11:
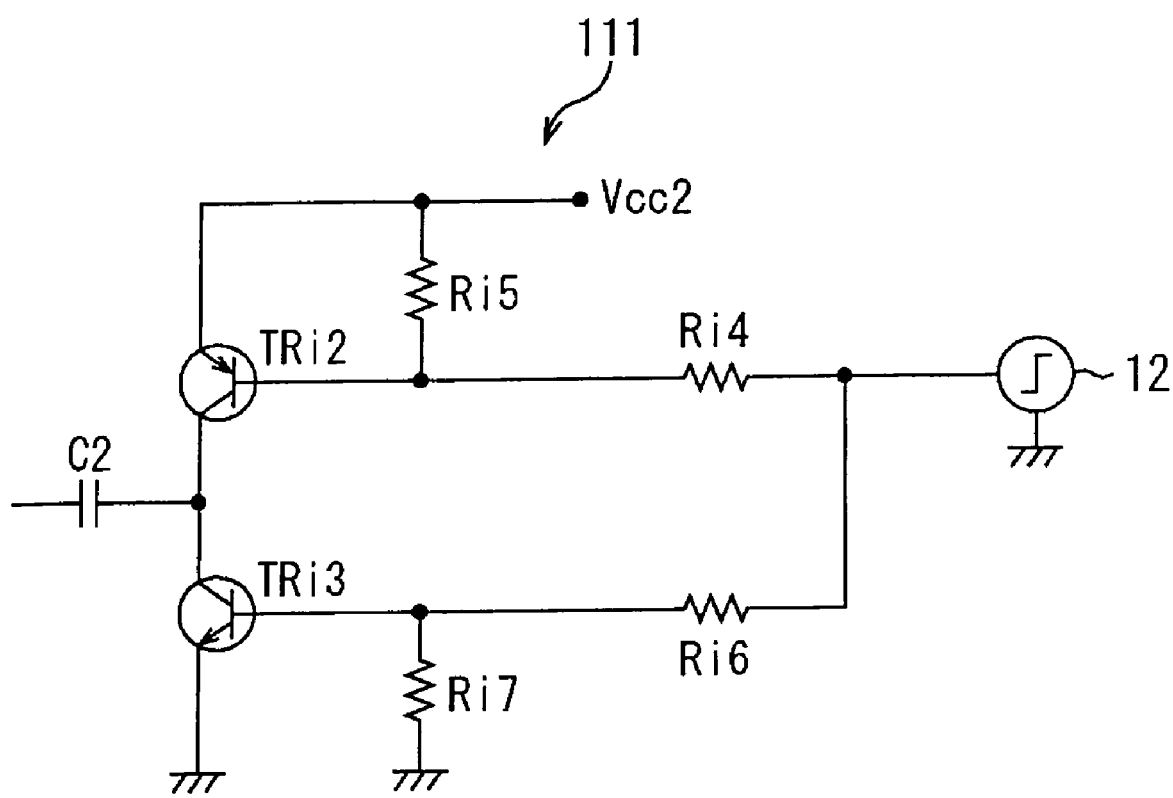
FIG. 11 is a circuit diagram showing another specific example of the configuration of the inverter of the transmission device of FIG. 9.
Figure 12:
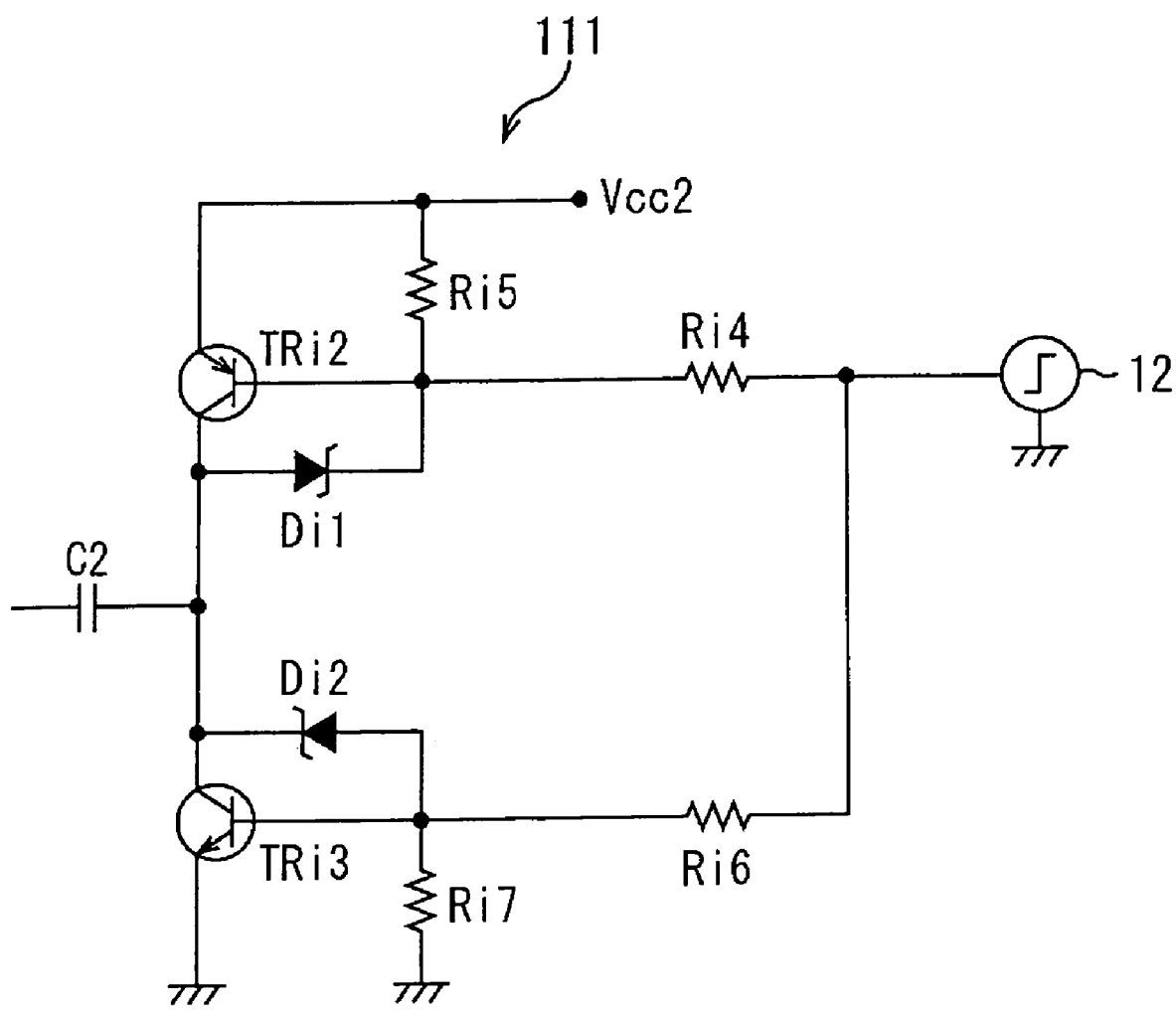
FIG. 12 is a circuit diagram showing another specific example of the configuration of the inverter of the transmission device of FIG. 9.

This inverter 111 can be embodied in various ways, as shown in FIGS. 10 to 12. Of course, the inverter 111 may be configured in ways other than that of FIGS. 10 to 12.

In the example of FIG. 10, the inverter 111 is formed of a transistor TRi1 which functions as a switch, a resistor Ri1, a resistor Ri2, and a resistor Ri3.

One end of the resistor Ri1 whose other end is connected to the transmission data output section 12 is connected to the base of the transistor TRi1, and one end of the resistor Ri2 whose other end is also grounded is connected thereto. The emitter of the transistor TRi1 is grounded. One end of the above-described capacitor C2 (the other end is connected to the emitters of the transistor TR1 and the transistor TR2, as shown in, for example, FIG. 9), which forms a differentiation circuit, is connected to the collector of the transistor TRi1, and one end of the resistor Ri3, to whose other end a voltage Vcc2 is applied, is connected thereto.

In this manner, the inverter 111 having the configuration of FIG. 10 has features that the configuration is simple. On the other hand, the inverter 111 has a problem in that, when the transistor TRi1 is in an on state, power consumption occurs. Therefore, when it is necessary to solve this problem, that is, when the inverter 111 which does not consume electrical current is required, for example, the inverter 111 may be configured as shown in FIG. 11.

That is, in the example of FIG. 11, the inverter 111 is formed of a PNP-type transistor TRi2, an NPN-type transistor TRi3, and resistors Ri4 to Ri7.

One end of the resistor Ri4 whose other end is connected to the transmission data output section 12 is connected to the base of the transistor TRi2, and one end of the resistor Ri5, to whose other end a voltage Vcc2 is applied, is also connected thereto. The voltage Vcc2 is applied to the emitter of the transistor TRi2. One end of the above-described capacitor C2 (the other end is connected to the emitters of the transistor TR1 and the transistor TR2, as shown in, for example, FIG. 9), which forms a differentiation circuit, is connected to the collector of the transistor TRi2, and the collector of the transistor TRi3 is also connected thereto.

In other words, one end of the capacitor C2 is connected to the collector of the transistor TRi3, and the collector of the transistor TRi2 is also connected thereto.

One end of the resistor Ri6 whose other end is connected to the transmission data output section 12 is connected to the base of the transistor TRi3, and one end of the resistor Ri7 whose other end is grounded is also connected thereto. The emitter of the transistor TRi3 is grounded.

Furthermore, when the inverter 111 whose operating speed is high is required, for example, the inverter 111 may be configured as shown in FIG. 12.

That is, in the example of FIG. 12, when compared to the inverter 111 having the configuration of FIG. 11, furthermore, a Schottky diode Di1 is connected between the base and the collector of the PNP-type transistor TRi2, and a Schottky diode Di2 is connected between the base and the collector of the NPN-type transistor TRi3.

In the manner described above, since the inverter 111 is configured as shown in FIG. 12, when it falls below a predetermined voltage, it is possible to suppress a decrease in the voltage of the emitter with respect to the base of the transistor TRi2 by causing electrical current to flow through the Schottky diode Di1. Also, when it falls below a predetermined voltage, it is possible to suppress a decrease in the voltage of the emitter with respect to the base of the transistor TRi3 by causing electrical current to flow through the Schottky diode Di2. That is, the storage time of each of the transistors TRi2 and TRi3 is decreased, and the switching speed of the transistors TRi2 and TRi3 can be increased.

The voltage Vcc2 shown in FIGS. 10 to 12 may be a voltage supplied from the same power source (not shown) as that of the voltage Vcc1 of FIG. 9, and may be a voltage supplied from a differing power source (not shown).

Next, the operation of the transmission device 51 will be described. The transmission device 51 may be embodied in various ways in the manner described above. Unless specified otherwise, a description is given by assuming the transmission device 51 to be the transmission device 51 having the configuration of FIG. 9.

Furthermore, the operation of the transmission device 51 is basically the same as the operation of the conventional transmission device 1 of FIG. 2. Accordingly, here, the descriptions of the operations described in the conventional transmission device 1 are omitted where appropriate, and in the following, descriptions will be given by placing emphasis on operations differing from those of the conventional transmission device 1.

More specifically, as shown in FIG. 9, when the first pulse signal 22 is output from the transmission data output section 12, the shaped-wave application section 61 causes the emitter loads of the transistor TR1 and the transistor TR2 to be changed by switching the transistor TRs in accordance with the first pulse signal 22 in a manner similar to the conventional case (is changed to either the value of the resistor R1 or the combined resistance value of the resistor R1 and the resistor R2), and also, applies, to the emitter loads, the high-frequency components (the high-frequency components 91 of FIG. 7) of the first pulse signal 22 extracted by the differentiation circuit including the capacitor C2 via the inverter 111.

The shaped-wave application section 61 operates in this manner, causing the emitter current corresponding to the signal wave applied to the emitters of the transistor TR1 and the transistor TR2 to be varied in such a manner as to correspond to the second pulse signal 71 such that the waveform of the first pulse signal 22 is shaped. In other words, the shaped-wave application section 61 applies, to the emitters of the transistor TR1 and the transistor TR2, the emitter current (signal wave) which varies in such a manner as to correspond to the second pulse signal 71.

As a result of the above, the emitter current (signal wave) of the transistor TR1 and the transistor TR2 greatly changes instantaneously when the first pulse signal 22 changes (at the rise time and the fall time of each pulse). As a result, there occurs a collector voltage Vc (amplitude-modulated wave 72) in which the change of the amplitude is strengthened, such as that shown at a changed portion 72-1 and a changed portion 72-2 in FIG. 13. Then, the drive energy corresponding to the generated collector voltage Vc (amplitude-modulated wave 72) is supplied to the antenna section 14, and a magnetic flux (electromagnetic wave) 73 shown in FIG. 14 is output from the antenna section 14.

Figure 13:
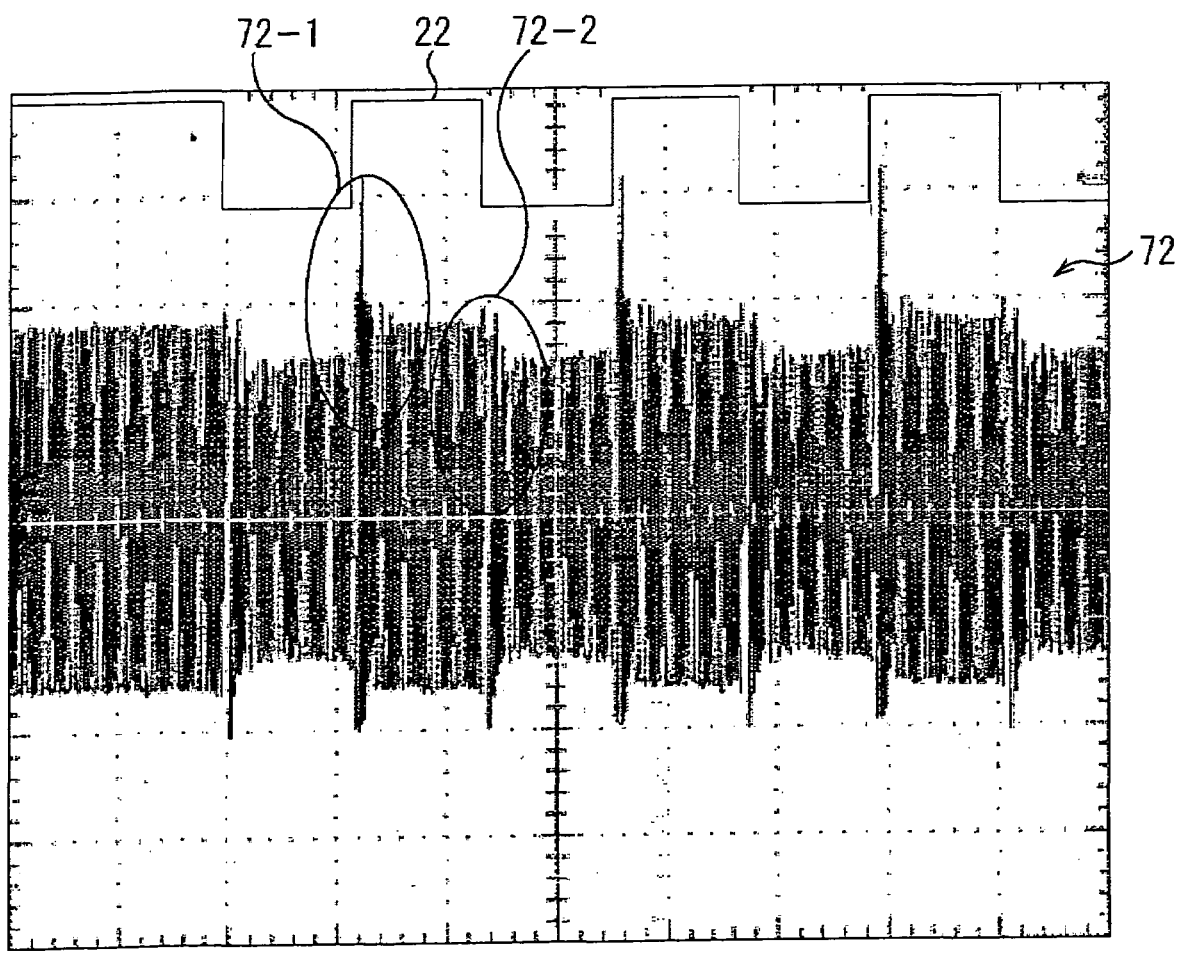
FIG. 13 is a measurement chart of a collector voltage (amplitude-modulated wave) of the transmission device of FIG. 9.

Accordingly, FIG. 13 shows a measurement chart of a collector voltage Vc (amplitude-modulated wave 72), which is actually output, in a state in which the first pulse signal 22 is output from the transmission data output section 12 in the transmission device 51 of FIG. 9. FIG. 14 shows a measurement chart of a magnetic flux (electromagnetic wave) 73, which is actually output, in a state in which the first pulse signal 22 is output from the transmission data output section 12 in the transmission device 51 of FIG. 9.

As shown in FIG. 13, the amplitude of the collector voltage Vc (amplitude-modulated wave 72) varies in such a manner as to correspond to the second pulse signal 71 (FIG. 6) whose waveform is shaped so that the level at each rise time of each pulse of the first pulse signal 22 becomes higher than the high level (H) in a steady state of the first pulse signal and the level at each fall time of each pulse of the first pulse signal 22 becomes lower than the low level (L) in the steady state of the first pulse signal 22. That is, as indicated at the changed portion 72-1, the amplitude of the collector voltage Vc (amplitude-modulated wave 72) at the rise time of the pulse of the pulse signal 22 is higher than the high level in the steady state thereof. Similarly, as indicated at the changed portion 72-2, the amplitude of the collector voltage Vc (amplitude-modulated wave 72) at the fall time of the pulse of the pulse signal 22 is lower than the low level in the steady state thereof.

Figure 14:
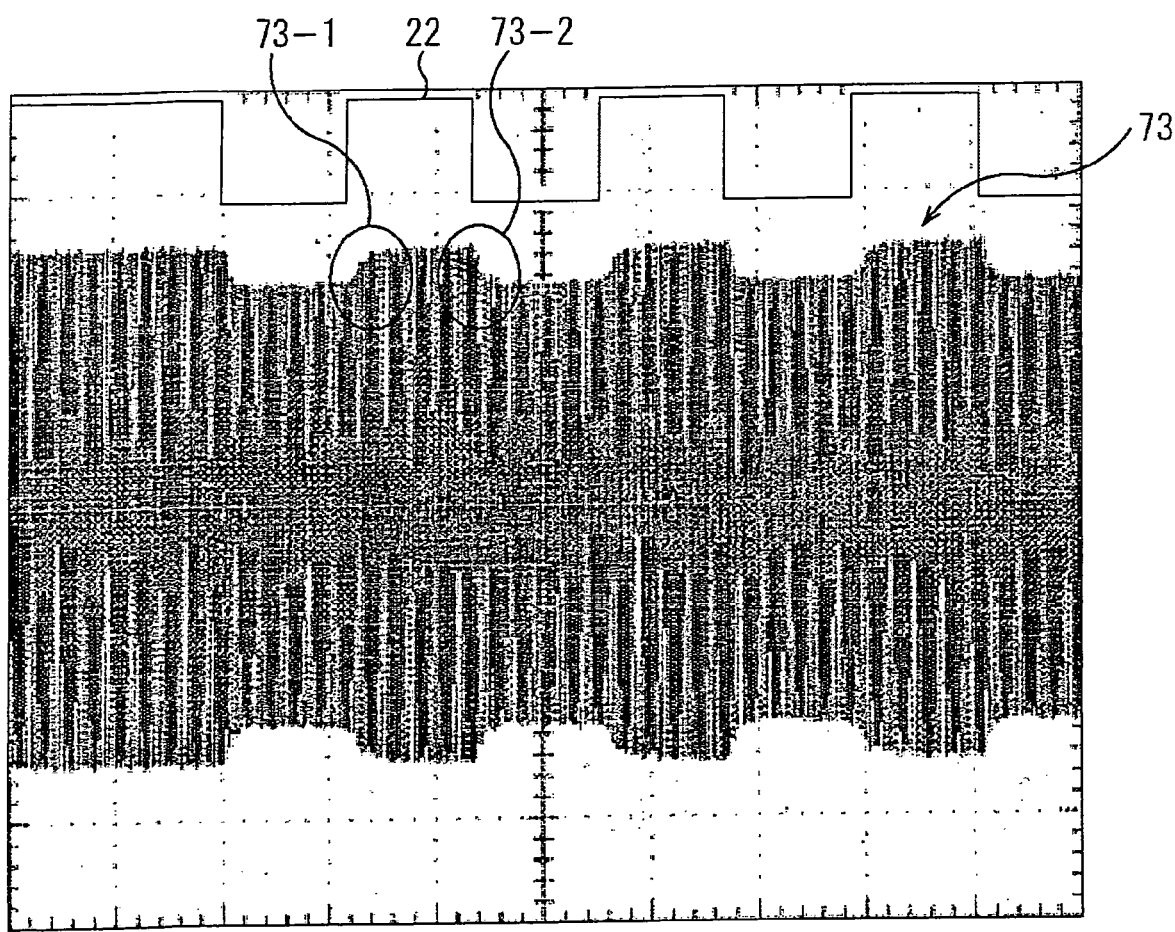
FIG. 14 is a measurement chart of a magnetic flux (electromagnetic wave) output from an antenna section of the transmission device of FIG. 9.

As a result, as shown in FIG. 14, the magnetic flux (electromagnetic wave) 73 output from the antenna section 14 varies almost instantaneously in such a manner as to follow the pulse signal 22 corresponding to the transmission data when compared to the above-described conventional magnetic flux (electromagnetic wave) 24 of FIG. 4. For example, as indicated at a changed portion 73-1, at the rise time of the pulse of the pulse signal 22, the amplitude of the magnetic flux (electromagnetic wave) 73 also varies almost instantaneously from a low level to a high level in such a manner as to follow the rise. Similarly, as indicated at a changed portion 73-2, at the fall time of the pulse of the pulse signal 22, the amplitude of the magnetic flux (electromagnetic wave) 73 also varies almost instantaneously from a high level to a low level in such a manner as to follow the fall.

In the foregoing, although the transmission device 51 has been described with reference to FIGS. 8 and 9, the transmission device 51 is not limited to the configuration of the example of FIG. 8 or 9, and can be embodied in various ways as long as the transmission device 51 is capable of outputting the collector voltage Vc (amplitude-modulated wave 72) such as that shown in FIG. 13.

For example, in the examples of FIGS. 8 and 9, for the purpose of reducing the influence of in-phase noise, the transmission device 51 is configured in such a manner that the transistor TR1 and the transistor TR2 for modulation and amplification are differentially connected. Alternatively, the transmission device 51 may be formed from only one of the transistor TR1 and the transistor TR2.

Furthermore, in practice, since a lot of electrical current of transistors for modulation and amplification is required, as shown in FIGS. 8 and 9, rather than each one of the transistor TR1 and the transistor TR2, which are differentially connected, is used, two sets of transistors such that a plurality of transistors are connected in parallel are provided, and the two sets, which are differentially connected, are used often.

Figure 15:
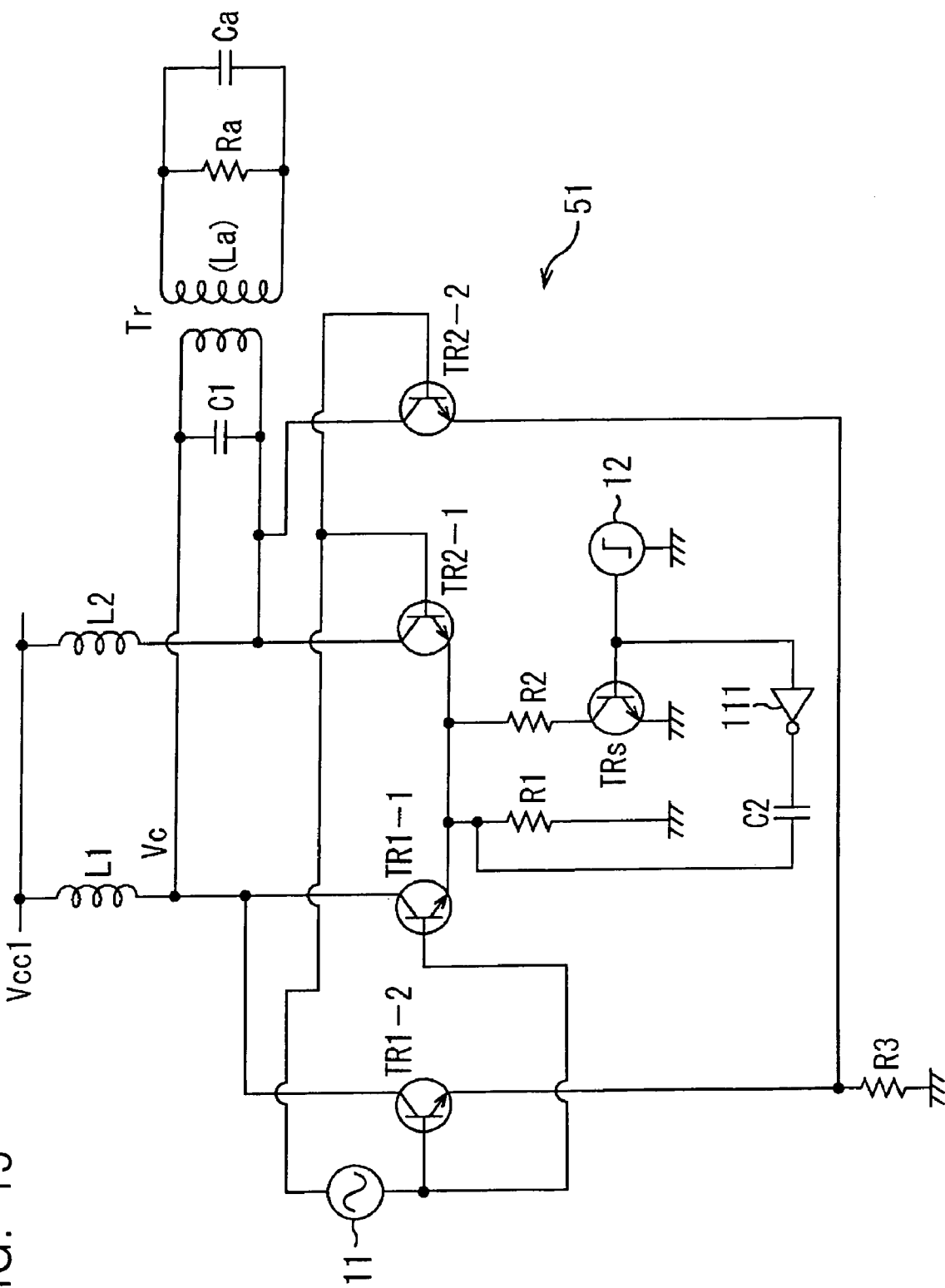
FIG. 15 is a circuit diagram showing another specific example of the configuration of the transmission device of FIG. 6.

More specifically, for example, the transmission device 51 is sometimes configured in such a manner that, as shown in FIG. 15, in place of the transistor TR1 of FIG. 9, a set in which two transistors TR1 and TR2 are connected in parallel, and a set in which two transistors TR1 and TR2 are connected in parallel in place of the transistor TR2 of FIG. 9 are connected in parallel, are differentially connected.

In such a case, the signal wave corresponding to the second pulse signal 71 (FIG. 6) such that the waveform of the first pulse signal 22 corresponding to the transmission data is shaped may be applied to all the emitters of the transistor TR1-1 and the transistor TR1-2 and the emitters of the transistor TR2-1 and the transistor TR2-2 (the emitter loads of all the transistors of each set may be varied, and also, the high-frequency components of the first pulse signal 22 may be applied to all the emitter loads), but the following problems arise.

Figure 17:
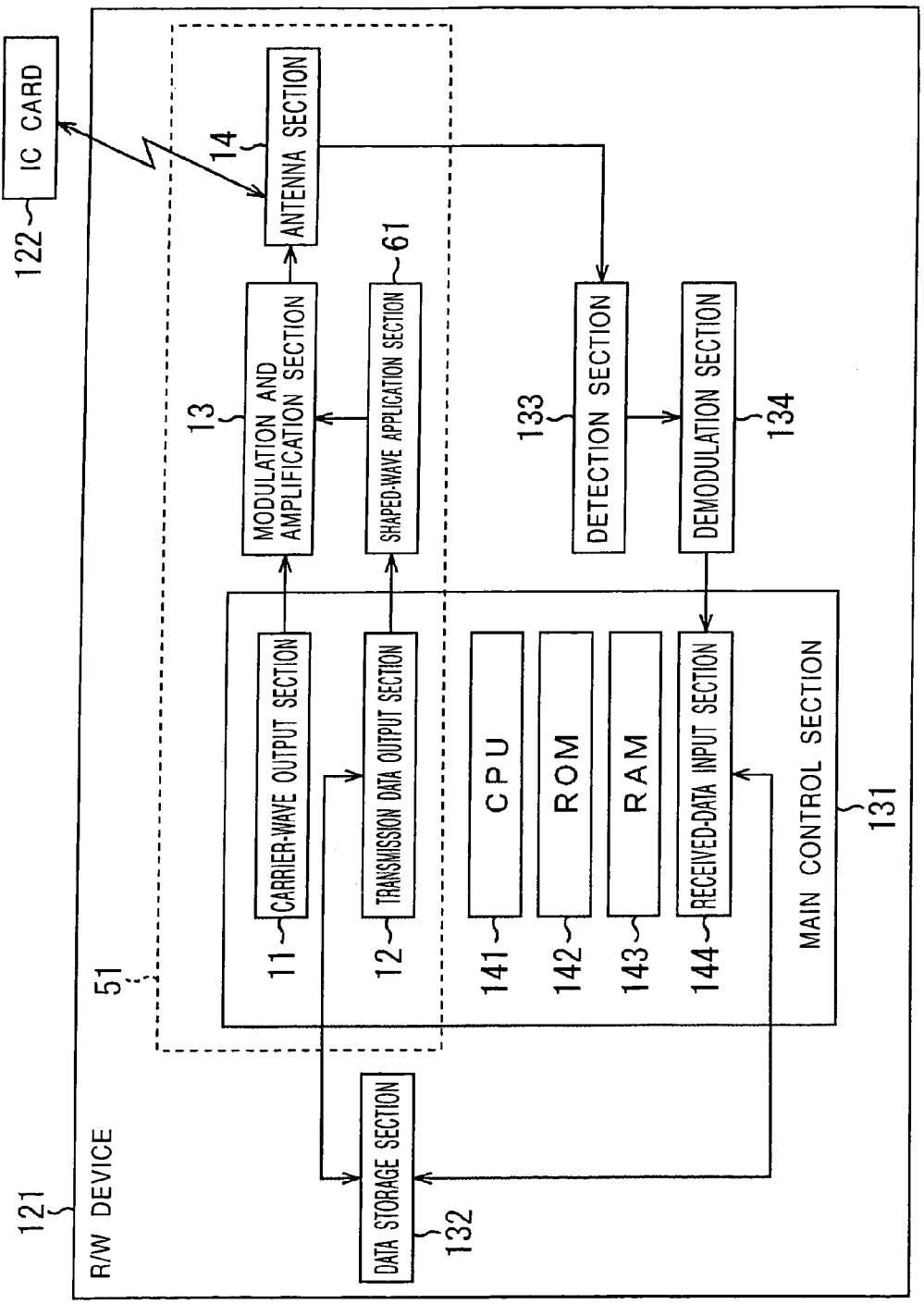
FIG. 17 is a block diagram showing an example of the configuration of an R/W device to which the present invention is applied.

That is, as shown in FIG. 17 (to be described later), in a case where the transmission device 51 is incorporated in an R/W device 121 of the IC card system, if an IC card 122, which is a communication party, comes too close to the R/W device 121, there are cases in which the load of the transmission device 51 varies. In such a case, there is a possibility that, because the peaking is too effective (the portion (the portion corresponding to the high-frequency components of the first pulse signal 22) is too sharp) when the amplitude of the amplitude-modulated wave 72 of FIG. 6 changes, power transmission is interrupted.

Therefore, in order to solve such problems, that is, in order to secure electrical power required for transmission, as shown in FIG. 15, the signal wave corresponding to the second pulse signal 71 (FIG. 6) may be applied to only the emitters of the transistor TR1-1 and the transistor TR1-2, and one end (the other end thereof is grounded) of the emitter resistor R3 may be connected to the emitters of the transistor TR1-2 and the transistor TR2-2 other than the above. In other words, as shown in FIG. 15, the emitter loads (the emitter loads formed of the resistor R1 and the resistor R2 which vary in response to the switching of the transistor TRs) which vary in such a manner as to correspond to the first pulse signal 22 output from the transmission data output section 12, and the high-frequency components of the first pulse signal 22 output from the differentiation circuit including the capacitor C2 via the inverter 111 may be applied to only the emitters of the transistor TR1-1 and the transistor TR2-1, and the emitter loads of the transistor TR1-2 and the transistor TR2-2 other than the above may be made constant.

Figure 16:
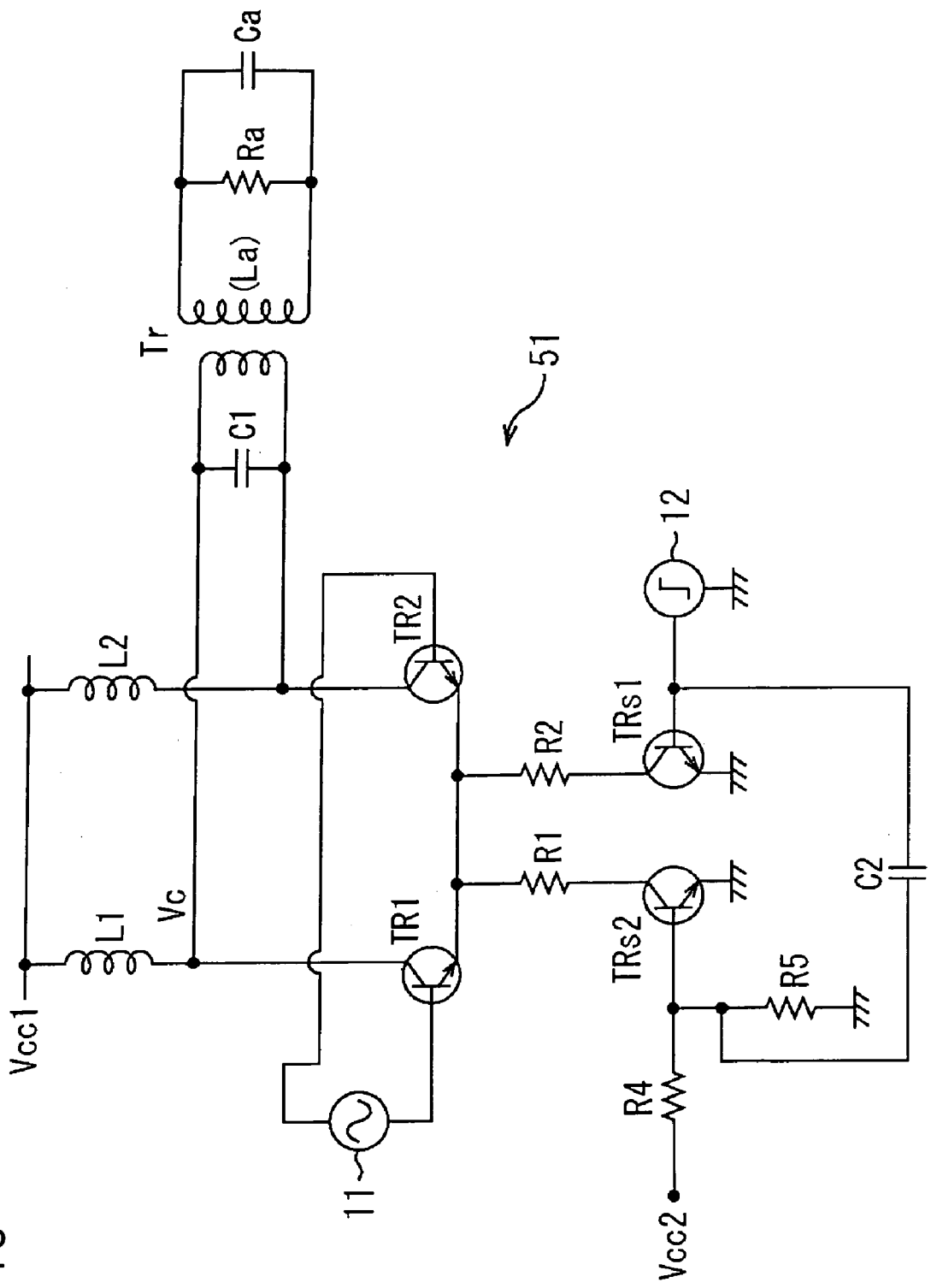
FIG. 16 is a circuit diagram showing another specific example of the configuration of the transmission device of FIG. 6.

Furthermore, the transmission device 51 can also be configured as shown in, for example, FIG. 16.

More specifically, in the example of FIG. 16, when compared to the example of FIG. 9, furthermore, the collector of a switching transistor TRs2 is connected to one end (the other end with respect to the end connected to the emitters of the transistor TR1 and the transistor TR2) of the resistor R1. The emitter of the transistor TRs2 is grounded. One end of the resistor R4, to which other end the voltage Vcc2 is always applied, is connected to the base of the transistor TRs2. That is, the transistor TRs2 is always turned on.

A differentiation circuit formed of a resistor R5 whose one end is grounded and a capacitor C2 is further connected to the base of the transistor TRs2. That is, in the example of FIG. 9, the high-frequency components of the first pulse signal 22 output from the transmission data output section 12 are directly applied to the emitters of the transistor TR1 and the transistor TR2. However, in the example of FIG. 16, the high-frequency components are applied to the base of the transistor TRs2. A transistor TRs1 is identical to the transistor TRs of FIG. 9.

Furthermore, the transmission device 51 may be a single device as in the above-described embodiment. Alternatively, the transmission device 51 may be incorporated in an information processing device as a portion of the information processing device.

For example, as shown in FIG. 17, the transmission device 51 may be a portion of the R/W device of the above-described IC card system. That is, FIG. 17 shows an example of the configuration of an R/W device to which the present invention is applied.

As shown in FIG. 17, an R/W device 121 is provided with a main control section 131 for controlling the entire R/W device 121, and a data storage section 132.

The main control section 131 is provided with a CPU (Central Processing Unit) 141, a ROM (Read Only Memory) 412, and a RAM 143. The CPU 141 performs various processes in accordance with a program stored in the ROM 142 or a program loaded from the data storage section 132, etc., into the RAM 143. In the RAM 143, data required for the CPU 141 to perform various processes is stored as appropriate.

The main control section 131 is further provided with a carrier-wave output section 11 and the transmission data output section 12, which are identical to those in FIG. 6.

The R/W device 121 is further provided with the modulation and amplification section 13, the antenna section 14, and the shaped-wave application section 61, which are identical to those in FIG. 6.

In other words, in the R/W device 121, as a transmission section, the transmission device 51 having the same configuration as that of FIG. 6 is incorporated.

The R/W device 121 is further provided with a detection section 133, a demodulation section 134, and a data input section 144 within the main control section 131, which form the receiving section with respect to the above-described transmission section (the transmission device 51).

Next, the operation of the R/W device 121 will be described briefly.

When the IC card 122, which is a communication party of the R/W device 121, is disposed so as to face the antenna section 14 of the R/W device 121 at a predetermined distance (communication distance), the antenna of the IC card 122 captures the magnetic flux output from the antenna section 14 and resonates mutually, thereby reaching a state in which non-contact communication is possible mutually.

In this state, when first digital information (data which is written into the IC card 122, etc.), which is prestored in the data storage section 132, is output as a pulse signal from the transmission data output section 12, the signal is superimposed (as an amplitude-modulated wave) onto the carrier wave output from the carrier-wave output section 11 in accordance with the same operating principles as those of the transmission device 51, the wave is supplied to the antenna section 14, and the wave is output as an electromagnetic wave from the antenna section 14.

The electromagnetic wave output from the antenna section 14 is received by the antenna of the IC card 122, and this wave is detected and demodulated into the first original information by the IC (not shown) of the IC card 122 in the manner described above. When the first information is data to be stored in the memory (not shown), the first information is stored in the memory within the IC. On the other hand, when the first information is data which instructs the reading of information, predetermined information is read from the memory within the IC on the basis of the first information.

Response data which notifies that the first information is recorded in the memory or data (second digital information) read from the memory within the IC is superimposed onto the carrier wave by the IC, and this wave is supplied to the antenna section 14 of the R/W device 121 via the antenna of the IC card 122.

More specifically, in this example, in the IC card 122, after the second information is coded, the equivalent load of the antenna of the IC card 122 is varied in accordance with the logic value of the signal thereof.

The load variation of the antenna of the IC card 122 appears as a load variation at the antenna end of the antenna section 14 of the R/W device 121.

Therefore, the detection section 133 detects this load variation as the amplitude varied components of the carrier wave, that is, an ASK (Amplitude Shift Keying) modulation signal.

That is, in this example, for the transmission of the data from the IC card 122 to the R/W device 121, a load modulation method is used in which, after data to be transmitted is coded, by varying the load such that the interior is viewed from the antenna terminal in accordance with the logic value of the signal, the radiated electromagnetic wave is ASK-modulated.

The demodulation section 134 demodulates the pulse signal corresponding to the second digital information from the ASK-modulated signal (the amplitude varied components of the carrier wave) detected by the detection section 133, and supplies the pulse signal to the received-data input section 144.

When the second digital information corresponding to the pulse signal supplied from the demodulation section 134 is response data, the received-data input section 144 supplies it to the CPU 141. On the other hand, when the second digital information is data to be written into the data storage section 132, the data is written (stored) into the data storage section 132. When the response data is obtained, the CPU 141 performs a process corresponding to the response data.

In this manner, the R/W device 121 writes the first digital information into the IC card 122 and reads the second digital information from the IC card 122 by performing non-contact communication with the IC card 122 via the antenna section 14.

In the manner described above, in the transmission device 51 (FIG. 6) of the present invention, the first pulse signal 22 in a rectangular waveform, which corresponds to the transmission data, is input. A signal wave is generated in such a manner as to correspond to the second pulse signal 71 whose waveform is shaped so that the level at each rise time of each pulse of the first input pulse signal 22 becomes higher than the high level (H) in the steady state of the first pulse signal 22 and the level at each fall time of each pulse of the first input pulse signal 22 becomes lower than the low level (L) in the steady state of the first input pulse signal 22. The generated signal wave is applied to the emitters of the transistors (for example, the transistor TR1 and the transistor TR2 of FIG. 9) of the modulation and amplification section 13. As a result, the carrier wave 22 applied to the base of the transistor is amplitude-modulated into an amplitude-modulated wave 72 in accordance with the signal wave corresponding to the second pulse signal 71 applied to the emitter of the transistor. The amplitude-modulated wave 72 is supplied (supplied as drive energy) to the antenna section 14 via the collector of the transistor, and the amplitude-modulated wave 72 is transmitted as the electromagnetic wave 73 from the antenna section 14 including a resonance circuit.

Since the amplitude of the electromagnetic wave 73 output from the antenna section 14 in this manner varies almost instantaneously in such a manner as to follow the first pulse signal 22 corresponding to the transmission data as described above, the electromagnetic wave 73 received by the receiver (for example, the IC card 122 of FIG. 17) can be demodulated almost accurately into the first original pulse signal 22 by the receiver. That is, it is possible for the transmission device 51 of the present invention to reduce the frequency of occurrence of communication failures at the receiving side.

Furthermore, as shown in, for example, FIG. 9, since the transmission device 51 can be configured by a simple circuit in which the capacitor C2 and the inverter 111 are added to the conventional transmission device 1 (FIG. 2), the transmission device 51 can be manufactured at approximately the same cost and with almost the same degree of hardware resources as that of the conventional transmission device 1.

In other words, it becomes possible to configure the transmission device 51 by merely performing a modification which does not require cost and whose operation is easy such as the shaped-wave application section 61 being added to the conventional transmission device 1. More specifically, for example, when the conventional transmission device 1 having the configuration of FIG. 2 is to be modified into the transmission device 51 having the configuration of FIG. 9, the person who makes the modification may connect the capacitor C2 and the inverter 111 as shown in FIG. 9.

In the above-described embodiment of the transmission device 51, transistors are used. Alternatively, in the configuration other than that shown in FIG. 12, in place of transistors, field-effect transistors (FET transistors) may be used.

For example, in the transmission device 51 having the configuration of FIG. 9, in place of the transistor TR1 and the transistor TR2, a field-effect transistor EFT1 and a field-effect transistor EFT2 (not shown) may be used, respectively. However, in this case, a connection is made in such a manner that the gates of the field-effect transistor EFT1 and the field-effect transistor EFT2 correspond to the bases of the transistor TR1 and the transistor TR2, respectively, the sources correspond to the emitters, and the drains correspond to the collectors.

What is claimed is:

1. An electronic circuit for amplitude-modulating digital data transmitted via an antenna including a resonance circuit, said electronic circuit comprising:
   a modulation circuit, having a first transistor, for amplitude-modulating a carrier wave applied to the base of said first transistor into an amplitude-modulated wave in accordance with a signal wave applied to the emitter of said first transistor and for supplying said amplitude-modulated wave to said antenna via the collector of said first transistor; and
   a signal-wave generation circuit for inputting a first pulse signal in a rectangular waveform corresponding to said digital data, for generating said signal wave in such a manner as to correspond to a second pulse signal whose waveform is shaped so that the level at each rise time of each pulse of said first input pulse signal becomes higher than the high level in a steady state of said first signal and the level at each fall time of each pulse of said first input pulse signal becomes lower than the low level in the steady state of said first signal, and for applying said generated signal wave to the emitter of said first transistor.

2. An electronic circuit according to claim 1, wherein said signal-wave generation circuit comprises:
   a load circuit, which serves as an emitter load of said first transistor;
   a load varying circuit for varying the emitter load of said load circuit in accordance with said first pulse signal; and
   an extraction circuit for extracting high-frequency components of said first pulse signal,
   wherein said signal wave corresponding to said second pulse signal is generated by applying, to said load circuit, said high-frequency components of said first pulse signal extracted by said extraction circuit.

3. An electronic circuit according to claim 2, wherein said extraction circuit is a differentiation circuit.

4. An electronic circuit according to claim 2, wherein said signal-wave generation circuit further comprises a buffer connected to the input of said extraction circuit.

5. An electronic circuit according to claim 2, wherein said load varying circuit comprises a second transistor that functions as a switch which is switched in accordance with said first pulse signal applied to the base, varies the emitter load by disconnecting, from said load circuit, a predetermined element which serves as a portion of an emitter load when said second transistor is turned off and by connecting said disconnected element to said load circuit when said second transistor is turned on, and
   said signal-wave generation circuit further includes an inverter circuit connected to the input of said extraction circuit.

6. An electronic circuit according to claim 5, wherein said inverter circuit is formed of a third transistor which functions as a switch, and a resistor.

7. An electronic circuit according to claim 6, wherein said inverter circuit comprises, as said third transistor, a set of an NPN-type transistor and a PNP-type transistor.

8. An electronic circuit according to claim 7, wherein said inverter circuit further comprises a Schottky diode connected between the base and the collector of each of said NPN-type transistor and said PNP-type transistor.

9. An electronic circuit according to claim 2, wherein there are a plurality of said first transistors,
   an emitter resistor differing from the resistor which forms said load circuit is connected to the emitter of one or more of first predetermined transistors among said plurality of first transistors, and
   said signal-wave generation circuit applies said signal wave corresponding to said second pulse signal such that the waveform of said first pulse signal is shaped, to the emitter of said first transistors excluding some transistors such that the emitter is connected to said emitter resistor among said plurality of first transistors.

10. A modulation method for use with a modulation circuit, having a transistor, which amplitude-modulates digital data transmitted via an antenna including a resonance circuit, for amplitude-modulating a carrier wave applied to the base of said transistor into an amplitude-modulated wave in accordance with a signal wave applied to the emitter of said transistor and for supplying said amplitude-modulated wave to said antenna via the collector of said transistor, said modulation method comprising the steps of:
   inputting a first pulse signal in a rectangular waveform corresponding to said digital data;
   generating said signal wave in such a manner as to correspond to a second pulse signal whose waveform is shaped so that the level at each rise time of each pulse of said first input pulse signal becomes higher than the high level in a steady state of said first signal and the level at each fall time of each pulse of said first input pulse signal becomes lower than the low level in the steady state of said first signal; and
   applying said generated signal wave to the emitter of said transistor.

11. An electronic circuit for amplitude-modulating digital data transmitted via an antenna including a resonance circuit, said electronic circuit comprising:
   a modulation circuit, having a field-effect transistor, for amplitude-modulating a carrier wave applied to the gate of said field-effect transistor into an amplitude-modulated wave in accordance with a signal wave applied to the source of said field-effect transistor and for supplying said amplitude-modulated wave to said antenna via the drain of said field-effect transistor; and
   a signal-wave generation circuit for inputting a first pulse signal in a rectangular waveform corresponding to said digital data, for generating said signal wave in such a manner as to correspond to a second pulse signal whose waveform is shaped so that the level at each rise time of each pulse of said first input pulse signal becomes higher than the high level in a steady state of said first pulse signal and the level at each fall time of each pulse of said first input pulse signal becomes lower than the low level in the steady state of said first pulse signal, and for applying said generated signal wave to the source of said field-effect transistor.

12. A modulation method for use with a modulation circuit, having a field-effect transistor, which amplitude-modulates digital data transmitted via an antenna including a resonance circuit, for amplitude-modulating a carrier wave applied to the source of said field-effect transistor into an amplitude-modulated wave in accordance with a signal wave applied to the source of said field-effect transistor and for supplying said amplitude-modulated wave to said antenna via the drain of said field-effect transistor, said modulation method comprising the steps of:

inputting a first pulse signal in a rectangular waveform corresponding to said digital data;

generating said signal wave in such a manner as to correspond to a second pulse signal whose waveform is shaped so that the level at each rise time of each pulse of said first input pulse signal becomes higher than the high level in a steady state of said first pulse signal and the level at each fall time of each pulse of said first input pulse signal becomes lower than the low level in the steady state of said first pulse signal; and applying said generated signal wave to the source of said field-effect transistor.

13. An information processing device for amplitude-modulating first digital information and transmitting the information, said information processing device comprising:

modulation means, having a transistor, for amplitude-modulating a carrier wave applied to the base of said transistor into an amplitude-modulated wave in accordance with a signal wave which corresponds to said first information, the signal wave being applied to the emitter of said transistor, and for outputting said amplitude-modulated wave via the collector of said transistor;

first output means for outputting said carrier wave applied to the base of said transistor;

second output means for outputting a first pulse signal in a rectangular waveform corresponding to said first information;

signal-wave generation means for generating said signal wave in such a manner as to correspond to a second pulse signal whose waveform is shaped so that the level at each rise time of each pulse of said first pulse signal output from said second output means becomes higher than the high level in a steady state of said first signal and the level at each fall time of each pulse of said first pulse signal becomes lower than the low level in the steady state of said first signal, and for applying said generated signal wave to the emitter of said first transistor; and antenna means, having a resonance circuit, for transmitting an electromagnetic wave based on said amplitude-modulated wave output from said modulation means to another information processing device.

14. An information processing device according to claim 13, further comprising:

detection means for detecting varied components of a waveform corresponding to second digital information which is transmitted from said other information processing device and which is received by said antenna means; and demodulation means for demodulating the signal corresponding to said second digital information from the varied components of said waveform detected by said detection means.

15. An information processing device according to claim 14, wherein said other information processing device is an IC card capable of non-contact communication, and said information processing device is a reader/writer device that writes said first information into said IC card and reads said second information from said IC card by performing non-contact communication with said IC card via said antenna means.

16. An information processing method for use with an information processing device comprising a modulation circuit, having a transistor, for amplitude-modulating a carrier wave applied to the base of said transistor into an amplitude-modulated wave in accordance with a signal wave which corresponds to digital information to be transmitted, the signal wave being applied to the emitter of said transistor, and for outputting said amplitude-modulated wave via the collector of said transistor; and an antenna, having a resonance circuit, for transmitting an electromagnetic wave based on said amplitude-modulated wave output from said modulation circuit to another information processing device, said information processing method comprising the steps of:

outputting said carrier wave applied to the base of said transistor;

outputting a first pulse signal in a rectangular waveform corresponding to said digital information;

generating said signal wave in such a manner as to correspond to a second pulse signal whose waveform is shaped so that the level at each rise time of each pulse of said first pulse signal becomes higher than the high level in a steady state of said first pulse signal and the level at each fall time of each pulse of said first pulse signal becomes lower than the low level in the steady state of said first pulse signal; and applying said generated signal wave to the emitter of said first transistor.

* * * * *